United States Patent
Watari et al.

(10) Patent No.: US 8,525,202 B2
(45) Date of Patent: Sep. 3, 2013

(54) LED PACKAGE, METHOD FOR MANUFACTURING LED PACKAGE, AND PACKING MEMBER FOR LED PACKAGE

(75) Inventors: Gen Watari, Fukuoka-ken (JP); Satoshi Shimizu, Fukuoka-ken (JP); Mami Yamamoto, Fukuoka-ken (JP); Hidenori Egoshi, Fukuoka-ken (JP); Hiroaki Oshio, Fukuoka-ken (JP); Tatsuo Tonedachi, Fukuoka-ken (JP); Kazuhisa Iwashita, Fukuoka-ken (JP); Tetsuro Komatsu, Fukuoka-ken (JP); Teruo Takeuchi, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 217 days.

(21) Appl. No.: 12/849,102

(22) Filed: Aug. 3, 2010

(65) Prior Publication Data
US 2011/0186900 A1 Aug. 4, 2011

(30) Foreign Application Priority Data
Jan. 29, 2010 (JP) .................................. 2010-019780

(51) Int. Cl.
*H01L 33/00* (2010.01)
(52) U.S. Cl.
USPC ........ 257/98; 257/99; 257/100; 257/E33.067; 257/E33.074; 362/311.02
(58) Field of Classification Search
USPC ........ 257/79, 98, 99, 100, E33.067, E33.074; 362/311.02
See application file for complete search history.

(56) References Cited

U.S. PATENT DOCUMENTS

| | | | | |
|---|---|---|---|---|
| 6,187,614 | B1 * | 2/2001 | Takata et al. | 438/112 |
| 6,888,231 | B2 * | 5/2005 | Maeda | 257/678 |
| 7,834,370 | B2 * | 11/2010 | Koya et al. | 257/98 |
| 7,897,989 | B2 * | 3/2011 | Kumura | 257/98 |
| 8,106,508 | B2 * | 1/2012 | Kobayakawa et al. | 257/730 |
| 8,158,997 | B2 * | 4/2012 | Fukasawa et al. | 257/98 |
| 2003/0071365 | A1 * | 4/2003 | Kobayakawa et al. | 257/787 |
| 2006/0054913 | A1 * | 3/2006 | Hadame et al. | 257/99 |
| 2006/0105485 | A1 * | 5/2006 | Basin et al. | 438/27 |
| 2010/0163920 | A1 | 7/2010 | Itai | |

FOREIGN PATENT DOCUMENTS

| | | |
|---|---|---|
| CN | 101364585 A | 2/2009 |
| JP | 52-88569 | 7/1977 |
| JP | 02-258573 | 10/1990 |
| JP | 03-087051 | 4/1991 |

(Continued)

OTHER PUBLICATIONS

Japanese Office Action for Japanese Patent Application No. 2010-019780 issued on Jan. 16, 2012.

(Continued)

*Primary Examiner* — Eduardo A Rodela
(74) *Attorney, Agent, or Firm* — White & Case LLP

(57) ABSTRACT

According to one embodiment, an LED package includes first and second lead frames, an LED chip and a resin body. The first and second lead frames are apart from each other. The LED chip is provided above the first and second lead frames, and the LED chip has one terminal connected to the first lead frame and another terminal connected to the second lead frame. In addition, the resin body covers the first and second lead frames and the LED chip, and has an upper surface with a surface roughness of 0.15 μm or higher and a side surface with a surface roughness higher than the surface roughness of the upper surface.

8 Claims, 19 Drawing Sheets

(56) References Cited

FOREIGN PATENT DOCUMENTS

| | | |
|---|---|---|
| JP | 04-230056 | 8/1992 |
| JP | 04-313257 | 11/1992 |
| JP | 08-186212 | 7/1996 |
| JP | 2000-512806 | 9/2000 |
| JP | 2001-343531 | 12/2001 |
| JP | 2003-110080 | 4/2003 |
| JP | 2003-174200 | 6/2003 |
| JP | 2003-234509 | 8/2003 |
| JP | 2004-521506 | 7/2004 |
| JP | 2004-247612 | 9/2004 |
| JP | 2004-274027 | 9/2004 |
| JP | 2005-033028 | 2/2005 |
| JP | 3108452 | 2/2005 |
| JP | 2005-353914 | 12/2005 |
| JP | 2006-093470 | 4/2006 |
| JP | 2006-093672 | 4/2006 |
| JP | 2007-027281 | 2/2007 |
| JP | 2007-281218 | 10/2007 |
| JP | 2007-288198 | 11/2007 |
| JP | 2007-324220 | 12/2007 |
| JP | 2007-335762 | 12/2007 |
| JP | 2008-112966 | 5/2008 |
| JP | 2008-218469 | 9/2008 |
| JP | 2009-130301 | 6/2009 |
| JP | 2009-147329 | 7/2009 |
| JP | D1375900 | 12/2009 |
| JP | D1375901 | 12/2009 |
| JP | 2010-019768 | 1/2010 |
| JP | 2010-019778 | 1/2010 |
| JP | 2010-019779 | 1/2010 |
| WO | 96/27903 | 9/1996 |
| WO | 97/50132 | 12/1997 |
| WO | 2005/091383 A1 | 9/2005 |
| WO | 2008153043 A1 | 12/2008 |
| WO | 2009072757 A2 | 6/2009 |
| WO | 2009072757 A3 | 6/2009 |
| WO | 2009/130957 | 10/2009 |

OTHER PUBLICATIONS

Japanese Office Action for Japanese Patent Application No. 2010-019780 mailed on Sep. 16, 2011.
Japanese Office Action for Japanese Patent Application No. 2012-172262 issued on Nov. 5, 2012.
Chinese Office Action for Chinese Patent Application No. 2010-10277976.5 issued on Aug. 2, 2012.
Japanese Office Action for Japanese Patent Application No. 2012-172262 issued on Aug. 29, 2012.
Japanese Office Action for Japanese Patent Application No. 2012-172262 issued on Mar. 7, 2013.
VISHAY Packaging and Order Information, Aug. 27, 2008; Figure 5.
Taiwanese Office Action issued on Jul. 3, 2013 in counterpart Taiwanese patent application No. 099129497, and English translation.

* cited by examiner

FIG. 9A SURFACE ROUGHNESS: 0.09 μm

FIG. 9B SURFACE ROUGHNESS: 2.0 μm

LED PACKAGE, METHOD FOR MANUFACTURING LED PACKAGE, AND PACKING MEMBER FOR LED PACKAGE

CROSS-REFERENCE TO RELATED APPLICATIONS

This application is based upon and claims the benefit of priority from the prior Japanese Patent Application No. 2010-19780, filed on Jan. 29, 2010; the entire contents of which are incorporated herein by reference.

FIELD

Embodiments described herein relate generally to an LED (Light Emitting Diode) package, a method for manufacturing an LED package and a packing member for an LED package.

BACKGROUND

Heretofore, an LED package in which an LED chip is mounted is prepared by mounting the LED chip on a lead frame and then sealing the lead frame and the LED chip with a resin material (for instance, refer to JP-A 2004-274027 (Kokai)).

Such an LED package, however, has a problem that the LED package is difficult to handle because of a resin material included therein. Specifically, since the resin material is exposed from most part of an outer surface of each LED package, LED packages may adhere to each other or may adhere to another member due to the softness and tackiness of the resin materials. An example thereof is that inspection of LED packages is made difficult when the LED packages adhere to each other after manufacturing and before conveyance to the inspection process. Another example is that unpacking LED packages at a delivery destination is made difficult when the LED packages adhere to a packing member during delivery.

BRIEF DESCRIPTION OF THE DRAWINGS

FIGS. 9A and 9B are optical micrographs illustrating the upper surface of the transparent resin body in the LED package after manufacturing,
FIG. 9A shows the upper surface having a surface roughness of 0.09 μm
and FIG. 9B shows the upper surface having a surface roughness of 2.0 μm.

DETAILED DESCRIPTION

Figure 1:
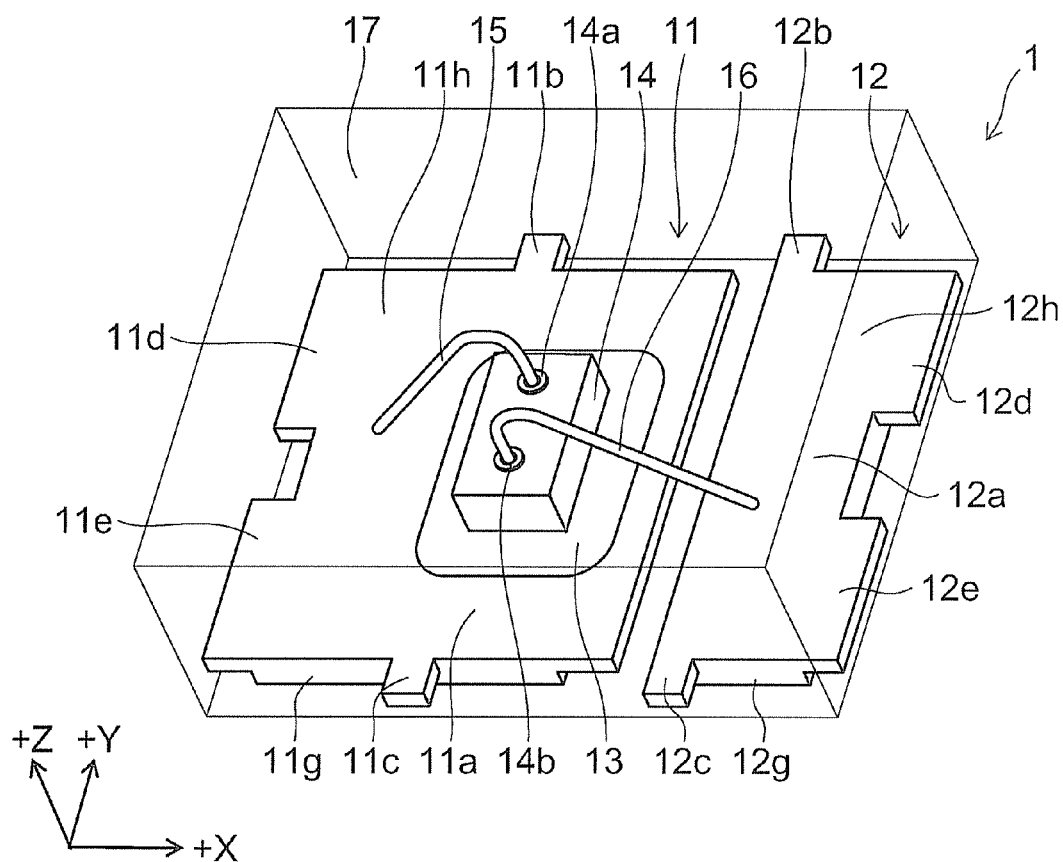
FIG. 1 is a perspective view illustrating an LED package according to a first embodiment.

In general, according to one embodiment, an LED package includes first and second lead frames, an LED chip and a resin body. The first and second lead frames are apart from each other. The LED chip is provided above the first and second lead frames, and the LED chip has one terminal connected to the first lead frame and another terminal connected to the second lead frame. In addition, the resin body covers the first and second lead frames and the LED chip, and has an upper surface with a surface roughness of 0.15 μm or higher and a side surface with a surface roughness higher than the surface roughness of the upper surface.

According to another embodiment, a method for manufacturing an LED package is disclosed. The method includes selectively removing part of a conductive material from a conductive sheet made of the conductive material to form a lead frame sheet in which a plurality of element regions are arranged in a matrix pattern, in which a base pattern including first and second lead frames arranged apart from each other is formed in each of the element regions, and in which the conductive material remains in each dicing region between the element regions in such a way as to connect the adjacent element regions to each other. The method includes mounting an LED chip on each of the element regions of the lead frame sheet, connecting one terminal of the LED chip to the first lead frame, and connecting another terminal of the LED chip to the second lead frame. The method includes forming a resin plate on the lead frame sheet to bury the LED chip into the resin plate, the resin plate having an upper surface with a surface roughness of 0.15 µm or higher. In addition, the method includes removing, by dicing, portions of the lead frame sheet and the resin plate disposed in the dicing region to cut the lead frame sheet and the resin plate into pieces each including the first and second lead frames and a resin body. A surface roughness of a surface processed by the dicing is increased higher than 0.15 µm by the cutting.

According to still another embodiment, a packing member for an LED package is disclosed. The LED package has first and second lead frames, an LED chip and a resin body. The first and second lead frames are apart from each other. The LED chip is provided above the first and second lead frames and the LED chip has one terminal connected to the first lead frame and another terminal connected to the second lead frame. The resin body covers the first and second lead frames and the LED chip, and has an upper surface with a surface roughness of 0.15 µm or higher and a side surface with a surface roughness higher than the surface roughness of the upper surface. In the packing member, a recessed portion to locate the LED package is formed. Unevenness is formed on at least a portion of a side surface of the recessed portion. The unevenness is greater than unevenness formed on the side surface of the resin body.

Hereinafter, embodiments of the invention will be described with reference to the drawings.

First of all, a first embodiment will be described.

The first to sixth embodiments are embodiments of LED packages.

FIG. 1 is a perspective view illustrating the LED package according to this embodiment.

Figure 2A:
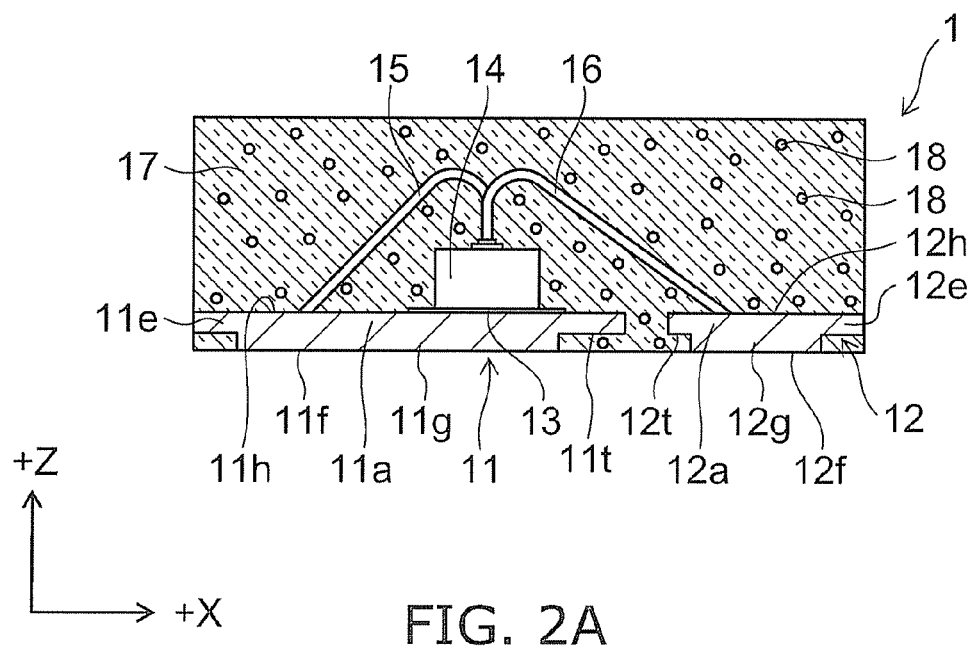
FIG. 2A is a cross-sectional view illustrating the LED package according to the first embodiment.
Figure 2B:
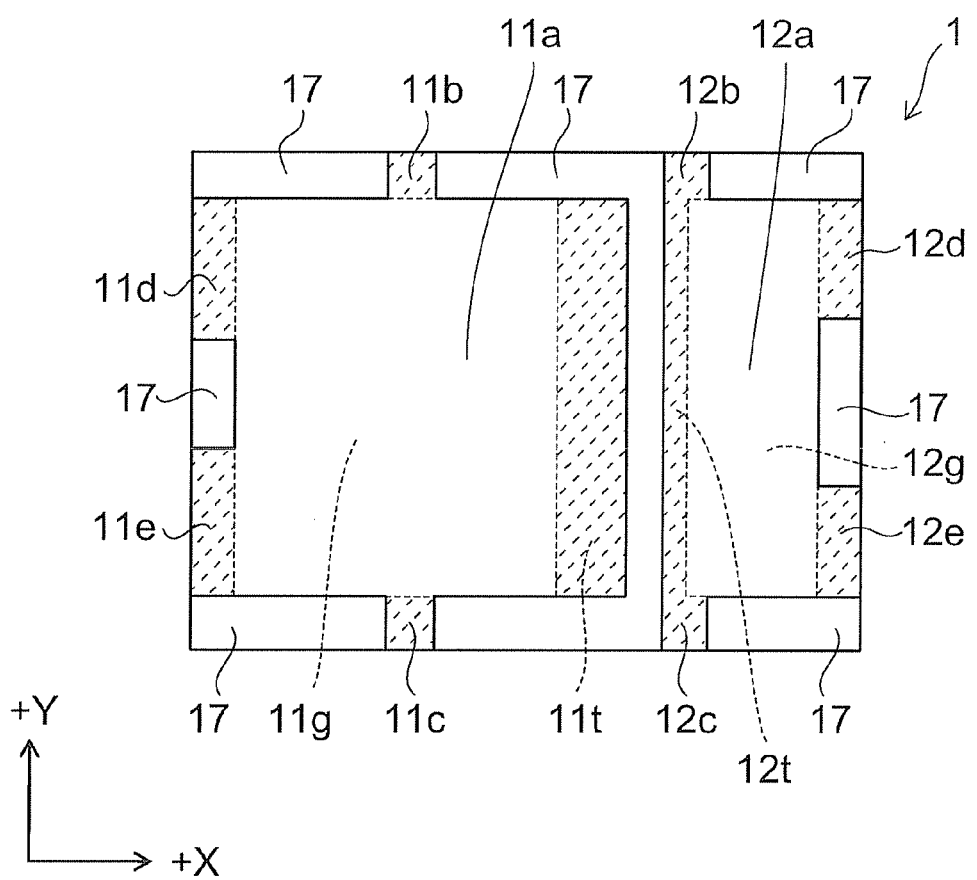
FIG. 2B is a plan view illustrating a lead frame.

FIG. 2A is a cross-sectional view illustrating the LED package according to this embodiment. FIG. 2B is a plan view illustrating lead frames.

As shown in FIGS. 1 to 2B, an LED package 1 according to this embodiment includes a pair of lead frames 11 and 12. The lead frames 11 and 12 each have a planar shape, and are disposed on the same plane but apart from each other. The lead frames 11 and 12 may be formed of the same conductive material. For example, each of the lead frames includes a copper plate and a silver plated layer formed on an upper surface and a lower surface of the copper plate. Incidentally, no silver plated layer is formed on edge surfaces of the lead frames 11 and 12, and the copper plates are exposed therefrom.

Hereinafter, in this specification, for convenience of description, an XYZ rectangular coordinate system is introduced. Among directions parallel to upper surfaces of the lead frames 11 and 12, a direction from the lead frame 11 to the lead frame is defined as a +X direction. Among directions perpendicular to the upper surfaces of the lead frames 11 and 12, an upward direction, i.e., a direction in which an LED chip 14 to be described later is mounted on the lead frames when seen therefrom, is defined as a +Z direction. One of directions which intersect both the +X direction and the +Z direction is defined as a +Y direction. Note that directions opposite to the +X direction, the +Y direction, and the +Z direction are respectively defined as a −X direction, a −Y direction, and a −Z direction. Meanwhile, for example, the "+X direction" and the "−X direction" may be collectively referred to as simply an "X direction."

The lead frame 11 includes a base portion 11a that is rectangular when seen in a Z direction. From this base portion 11a, four extending portions 11b, 11c, 11d, 11e are extended. The extending portion 11b extends in the +Y direction from a central portion, in the X direction, of an edge of the base portion 11a, the edge being directed in the +Y direction. The extending portion 11c extends in the −Y direction from a central portion, in the X direction, of an edge of the base portion 11a, the edge being directed in the −Y direction. The positions of the extending portion 11b and 11c correspond to each other in the X direction. The extending portions 11d and 11e extend in the −X direction respectively from end portions of an edge of the base portion 11a, the edge being directed in the −X direction. In this manner, each of the extending portion 11b to 11e extends from a corresponding one of three different sides of the base portion 11a.

The length in the X direction of the lead frame 12 is shorter than that of the lead frame 11, and the length in a Y direction are the same between the two. The lead frame 12 includes a base portion 12a that is rectangular when seen in the Z direction. From this base portion 12a, four extending portions 12b, 12c, 12d, 12e are extended. The extending portion 12b extends in the +Y direction from an end portion of the −X direction side, of an edge of the base portion 12a, the edge being directed in the +Y direction. The extending portion 12c extends in the −Y direction from an end portion of the −X direction side, of an edge of the base portion 12a, the edge being directed in the −Y direction. The extending portions 12d and 12e extend in the +X direction respectively from end portions of an edge of the base portion 12a, the edge being directed in the +X direction. In this manner, each of the extending portions 12b to 12e extends from a corresponding one of three different sides of the base portion 12a. The widths of the extending portions 11d and 11e of the lead frame 11 may be the same as or different from the widths of the extending portions 12d and 12e of the lead frame 12. However, in case that the widths of the extending portions 11d and 11e are different from the widths of the extending portions 12d and 12e, an anode and a cathode are easily distinguishable from each other.

A projected portion 11g is formed on a central portion, in the X direction, of the base portion 11a at a lower surface 11f of the lead frame 11. Accordingly, the lead frame 11 has two levels of thickness. The central portion, in the X direction, of the base portion 11a, i.e., a portion where the projected portion 11g is formed, is relatively thick, while an edge portion, in the +X direction, of the base portion 11a as well as the extending portion 11b to 11e are relatively thin. FIG. 2B shows a thin plate portion 11t that is a portion of the base portion 11a where the projected portion 11g is not formed. Similarly, a projected portion 12g is formed on a central portion, in the X direction, of the base portion 12a at a lower surface 12f of the lead frame 12. Accordingly, the lead frame 12 has two levels of thickness. The central portion, in the X direction, of the base portion 12a is relatively thick because the projected portion 12g is formed, while an edge portion, in the −X direction, of the base portion 12a as well as the extending portions 12b to 12e are relatively thin. FIG. 2B shows a thin plate portion 12t that is a portion of the base portion 12a where the projected portion 12g is not formed. To put these differently, indentations are formed at lower surfaces of the edge portion, in the +X direction, of the base portion 11a and the edge portion, in the −X direction, of the base portion 12a. The indentations extend in the Y direction along edges of the base portions 11a and 12a. In FIG. 2B, the relatively thin portions of the lead frames 11 and 12, i.e., the thin plate portions and the extending portions, are indicated by hatch with broken lines.

The projected portions 11g and 12g are formed in regions of the lead frames 11 and 12, the regions being apart from the edges of the lead frames 11 and 12, the edges facing each other. Regions including these edges are the thin plate portions 11t and 12t. An upper surface 11h of the lead frame 11 and an upper surface 12h of the lead frame 12 are on the same plane. A lower surface of the projected portion 11g of the lead frame 11 and a lower surface of the projected portion 12g of the lead frame 12 are on the same plane. The positions of upper surfaces of the extending portions in the Z direction coincide with the positions of the upper surfaces of the lead frames 11 and 12. Thus, the extending portions are disposed on the same XY plane.

A die mounting material 13 is attached to a portion of a region of the upper surface 11h of the lead frame 11, the region corresponding to the base portion 11a. In this embodiment, the die mounting material 13 may be conductive or insulating. When the die mounting material 13 is conductive, the die mounting material 13 is formed of, for example, a silver paste, solder, eutectic solder, or the like. When the die mounting material 13 is insulating, the die mounting material 13 is formed of, for example, a transparent resin paste.

The LED chip 14 is provided on the die mounting material 13. Specifically, the die mounting material 13 fixes the LED chip 14 to the lead frame 11, and thereby the LED chip 14 is mounted on the lead frame 11. The LED chip 14 has a substrate and a semiconductor layer stacked on the substrate. The semiconductor layer is made of gallium nitride (GaN) or the like and the substrate is a sapphire substrate, for example. The shape is, for example, a rectangular parallelepiped. Terminals 14a and 14b are provided on an upper surface of the LED chip 14. The LED chip 14 emits blue light, for example, when a voltage is supplied between the terminal 14a and the terminal 14b.

One end of a wire 15 is bonded to the terminal 14a of the LED chip 14. The wire 15 is led out from the terminal 14a in the +Z direction (immediately upward direction) and curved in a direction between the −X direction and the −Z direction. The other end of the wire 15 is bonded to the upper surface 11h of the lead frame 11. Thereby, the terminal 14a is connected to the lead frame 11 through the wire 15. Meanwhile, one end of a wire 16 is bonded to the terminal 14b. The wire 16 is led out from the terminal 14b in the +Z direction and curved in a direction between the +X direction and the −Z direction. The other end of the wire 16 is bonded to the upper surface 12h of the lead frame 12. Thereby, the terminal 14b is connected to the lead frame 12 through the wire 16. The wires 15 and 16 are formed of a metal, for example, gold or aluminum.

The LED package 1 also includes a transparent resin body 17. The transparent resin body 17 is formed of a transparent resin, for example, a silicone resin. Herein, the term "transparent" includes meaning of translucent, also. The transparent resin body 17 has an appearance of rectangular parallelepiped, and covers the lead frames 11 and 12, the die mounting material 13, the LED chip 14, and the wires 15 and 16. The appearance of the transparent resin body 17 is the appearance of the LED package 1. A portion of the lead frame 11 and a portion of the lead frame 12 are exposed from a lower surface and side surfaces of the transparent resin body 17.

More specifically, the lower surface of the projected portion 11g, which is a part of the lower surface 11f of the lead frame 11, is exposed from the lower surface of the transparent resin body 17. Tip edge surfaces of the extending portions 11b to 11e are exposed from the side surfaces of the transparent resin body 17. Meanwhile, the entire upper surface 11h, a region of the lower surface 11f other than the projected portion 11g, side surfaces of the projected portion 11g, and edge surfaces of the base portion 11a of the lead frame 11 are covered with the transparent resin body 17. Similarly, the lower surface of the projected portion 12g of the lead frame 12 is exposed from the lower surface of the transparent resin body 17. Tip edge surfaces of the extending portions 12b to 12e are exposed from the side surfaces of the transparent resin body 17. The entire upper surface 12h, a region of the lower surface 12f other than the projected portion 12g, side surfaces of the projected portion 12g, and edge surfaces of the base portion 12a are covered with the transparent resin body 17. In the LED package 1, the lower surfaces of the projected portions 11g and 12g, exposed from the lower surface of the transparent resin body 17, serve as external electrode pads. As described above, the transparent resin body 17 has a rectangular shape when seen from above, and the tip edge surfaces of the aforementioned multiple extending portions of each of the lead frames 11 and 12 are exposed from a corresponding one of the is three different side surfaces of the transparent resin body 17. Note that in this specification, the term "cover" is a concept including both a case where one that covers is in contact with one that is covered and a case where the two are not in contact with each other.

Multiple phosphors 18 are dispersed in the transparent resin body 17. Each of the phosphors 18 is particulate, which absorbs light emitted from the LED chip 14 and emits light having a longer wavelength than the absorbed light. For example, the phosphor 18 absorbs part of blue light emitted from the LED chip 14 and emits yellow light. Thereby, blue light emitted by the LED chip 14 but not absorbed by the phosphor 18 and yellow light emitted from the phosphor 18 are emitted from the LED package 1. Hence, emission light from the LED package 1 becomes white as a whole. As such a phosphor 18, for example, YAG:Ce can be used. Incidentally, for convenience of illustration, in FIGS. 1, 2B and 3 as well as the drawings subsequent to FIG. 3, no phosphor 18 is illustrated. Moreover, in FIG. 2A, the phosphors 18 are illustrated larger and fewer than the actual ones.

As such phosphors 18, for example, a silicate-based phosphor which emits yellow-green, yellow, or orange light can be used. The silicate-based phosphor can be represented by the following general formula.

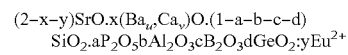

$(2-x-y)SrO \cdot x(Ba_u, Ca_v)O \cdot (1-a-b-c-d)SiO_2 \cdot aP_2O_5 \cdot bAl_2O_3 \cdot cB_2O_3 \cdot dGeO_2 : yEu^{2+}$ Here, $0<x$, $0.005<y<0.5$, $x+y \leq 1.6$, $0 \leq a, b, c, d<0.5$, $0<u$, $0<v$, and $u+v=1$.

As the yellow phosphor, a YAG-based phosphor can also be used. The YAG-based phosphor can be represented by the following general formula.

$(RE_{1-x}Sm_x)_3(Al_yGa_{1-y})_5O_{12} : Ce$

Here, $0 \leq x<1$, $0 \leq y \leq 1$, and RE is at least one element selected from Y and Gd.

As the phosphors 18, sialon-based red and green phosphors can also be mixed for use. Specifically, the phosphors can be a green phosphor which absorbs blue light emitted from the LED chip 14 and emits green light, and a red phosphor which absorbs blue light and emits red light.

The sialon-based red phosphor can be represented by the following general formula, for example.

$(M_{1-x}R_x)_{a1}AlSi_{b1}O_{c1}N_{d1}$

Here, M is at least one metal element except for Si and Al, and is particularly desirably at least one of Ca and Sr. R is a luminescent center element, and is particularly desirably Eu.

Additionally, x, a1, b1, c1, and d1 satisfy $0 < x \leqq 1$, $0.6 < a1 < 0.95$, $2 < b1 < 3.9$, $0.25 < c1 < 0.45$, and $4 < d1 < 5.7$.

A specific example of such a sialon-based red phosphor is represented below.

$$Sr_2Si_7Al_7ON_{13}:Eu^{2+}$$

The sialon-based green phosphor can be represented by the following general formula, for example.

$$(M_{1-x},R_x)_{a2}AlSi_{b2}O_{c2}N_{d2}$$

Here, M is at least one metal element except for Si and Al, and is particularly desirably at least one of Ca and Sr. R is a luminescent center element, and is particularly desirably Eu. Additionally, x, a2, b2, c2, and d2 satisfy $0 < x \leqq 1$, $0.93 < a2 < 1.3$, $4.0 < b2 < 5.8$, $0.6 < c2 < 1$, and $6 < d2 < 11$.

A specific example of such a sialon-based green phosphor is represented below.

$$Sr_3Si_{13}Al_3O_2N_{21}:Eu^{2+}$$

Additionally, in this embodiment, an upper surface 17a of the transparent resin body 17 has a surface roughness (Ra) of 0.15 µm or higher. As described later, unevenness of the upper surface 17a of the transparent resin body 17 is formed as a result of transferring unevenness from a release sheet that is used when the transparent resin is molded. Thus, if the surface roughness of the release sheet is 0.15 µm or higher, the surface roughness of the upper surface 17a of the transparent resin body 17 can be 0.15 µm or higher. Note that, since the side surfaces of the transparent resin body 17 are surfaces processed by dicing, the surface roughnesses of the side surfaces are greater than the surface roughness of the upper surface thereof.

Next, a method for manufacturing the LED package according to this embodiment will be described.

Figure 3:
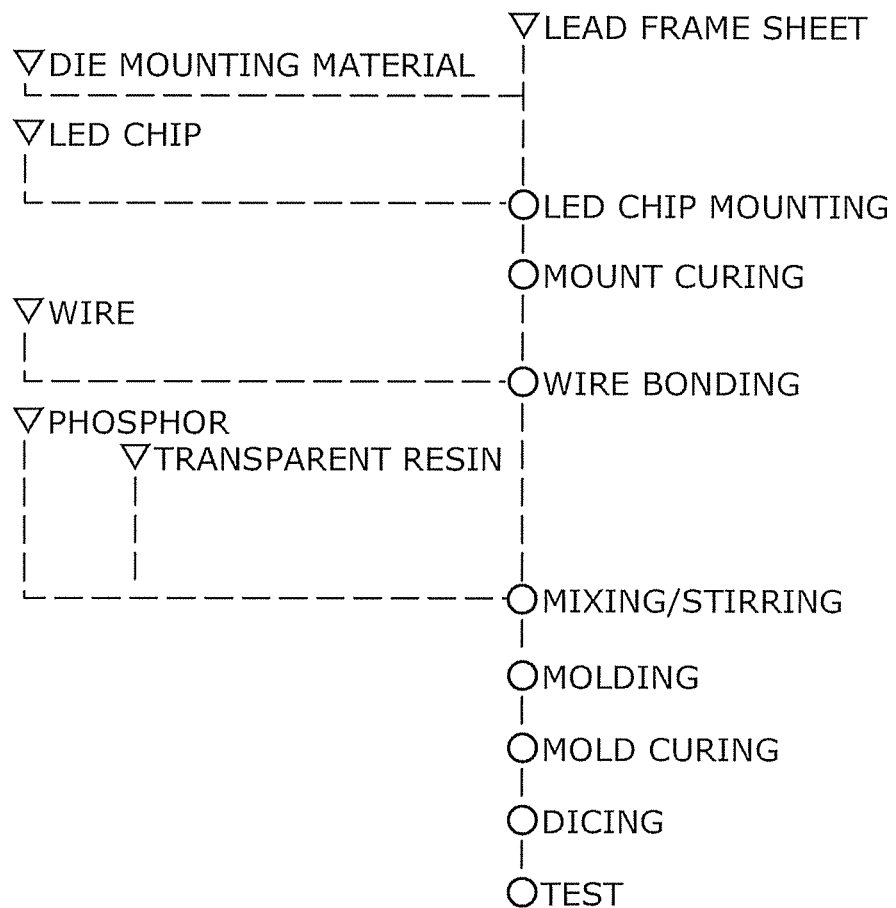
FIG. 3 is a flow chart illustrating a method for manufacturing the LED package according to the first embodiment.

FIG. 3 is a flowchart illustrating the method for manufacturing the LED package according to this embodiment.

FIGS. 4A to 6B are process sectional views illustrating the method for manufacturing the LED package according to this embodiment.

Figure 7A:
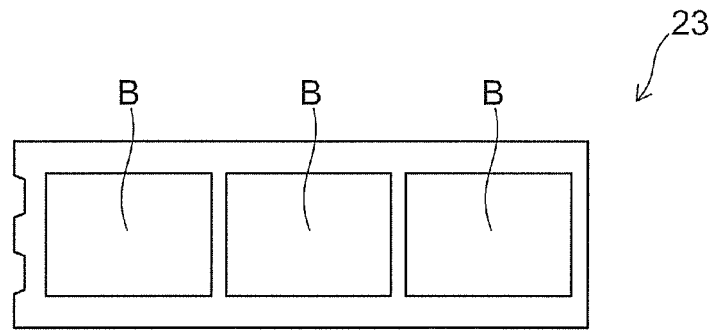
FIG. 7A is a plan view illustrating a lead frame sheet in the first embodiment.
Figure 7B:
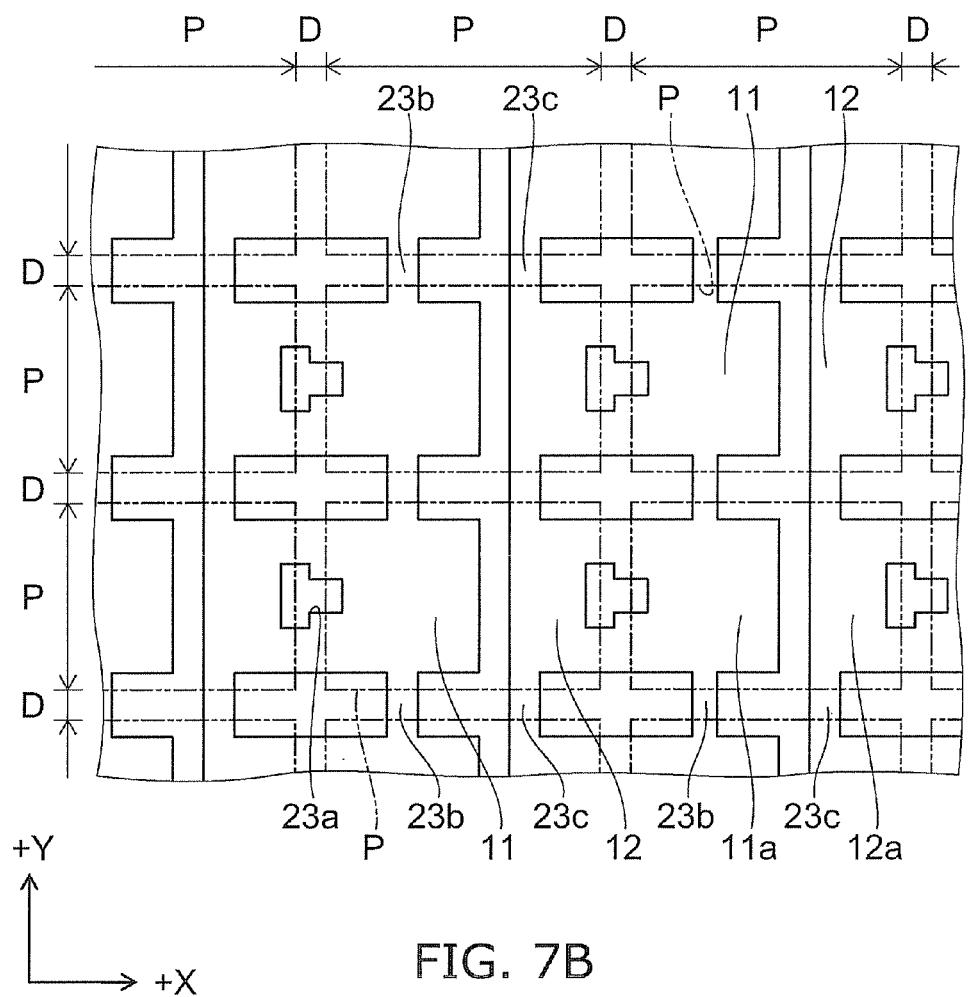
FIG. 7B is a partially enlarged plan view illustrating element regions of the lead frame sheet.

FIG. 7A is a plan view illustrating a lead frame sheet in this embodiment. FIG. 7B is a partially enlarged plan view illustrating element regions of the lead frame sheet.

Figure 4A:
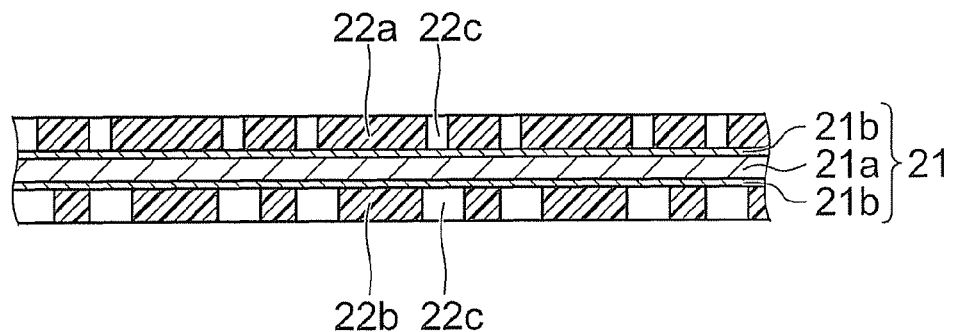
FIGS. 4A to 6B are process sectional views illustrating the method for manufacturing the LED package according to the first embodiment.

First, as shown in FIG. 4A, a conductive sheet 21 made of a conductive material is prepared. The conductive sheet 21 includes, for example, a strip-shaped copper plate 21a and silver plated layers 21b formed on upper and lower surfaces of the copper plate 21a. Next, masks 22a and 22b are formed respectively on the upper and lower surfaces of the conductive sheet 21. Openings 22c are selectively formed in the masks 22a and 22b. The masks 22a and 22b can be formed by a printing method, for example.

Next, the conductive sheet 21 to which the masks 22a and 22b are attached is immersed in an etchant, and the conductive sheet 21 is wet-etched. Thereby, portions, of the conductive sheet 21, locating inside the openings 22c are selectively removed by etching. In this event, for example, by adjusting the immersion time, the etching amount is controlled, so that the etching is stopped before the conductive sheet 21 is penetrated by sole etching from either the upper surface side or the lower surface side of the conductive sheet 21. In this manner, half-etching is performed from the upper and lower surface sides. However, portions, of the conductive sheet 21, etched from both the upper surface side and the lower surface side are penetrated. After that, the masks 22a and 22b are removed.

Figure 4B:
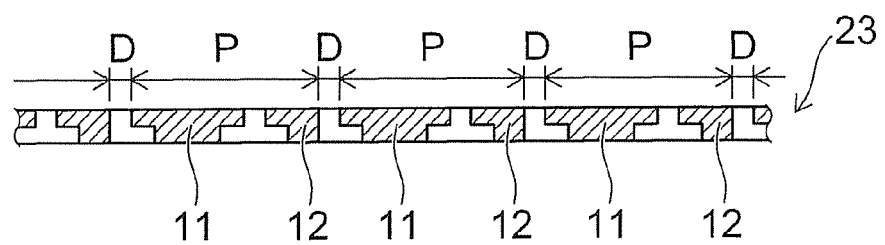

Thus, as shown in FIGS. 3 and 4B, the copper plate 21a and the silver plated layers 21b are selectively removed from the conductive sheet 21, and a lead frame sheet 23 is formed. Incidentally, for convenience of illustration, in FIG. 4B and the subsequent drawings, the copper plate 21a and the silver plated layer 21b are not distinguished from each other, and integrally illustrated as the lead frame sheet 23. For example, three blocks B are set in the lead frame sheet 23 as shown in FIG. 7A. In each of the blocks B, for example, approximately 1000 element regions P are set. As shown in FIG. 7B, the element regions P are arranged in a matrix pattern, and a dicing region D is formed in a lattice pattern among the element regions P. In each of the element regions P, a basic pattern including lead frames 11 and 12 which are apart from each other is formed. The metal material forming the conductive sheet 21 is left remained in the dicing region D in such a way as to connect the adjacent element regions P to each other.

Specifically, although the lead frame 11 and the lead frame 12 are apart from each other in the element region P, a lead frame 11 belonging to a certain element region P is connected to a lead frame 12 belonging to an element region P adjacent to the certain element region P in the −X direction when seen therefrom. Between the two frames, a projected opening 23a directed in the +X direction is formed. Moreover, lead frames 11 respectively belonging to element regions P adjacent to each other in the Y direction are connected through a bridge 23b. Similarly, lead frames 12 respectively belonging to element regions P adjacent to each other in the Y direction are connected through a bridge 23c. Thus, four conductive members extend in three directions from each of base portions 11a and 12a of the lead frames 11 and 12. Furthermore, by performing half-etching when the lead frame sheet 23 is etched from a lower surface side thereof, projected portions 11g and 12g are formed respectively on lower surfaces of the lead frames 11 and 12 (see FIGS. 2A and 2B).

Figure 4C:
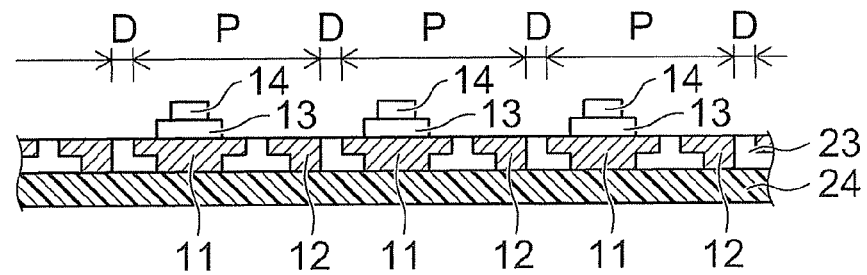

Next, as shown in FIGS. 3 and 4C, a reinforcement tape 24 made of, for example, a polyimide is pasted on the lower surface of the lead frame sheet 23. Then, a die mounting material 13 is attached onto each of the lead frames 11 belonging to the element regions P of the lead frame sheet 23. For example, a pasty die mounting material 13 is ejected onto the lead frame 11 from an ejector, or transferred onto the lead frame 11 in a mechanical way. Next, an LED chip 14 is mounted on the die mounting material 13. Next, a thermal treatment for sintering the die mounting material 13 is performed (mount cure). Thus, in each of the element regions P of the lead frame sheet 23, the LED chip 14 is mounted above the lead frame 11 with the die mounting material 13 interposed therebetween.

Figure 4D:
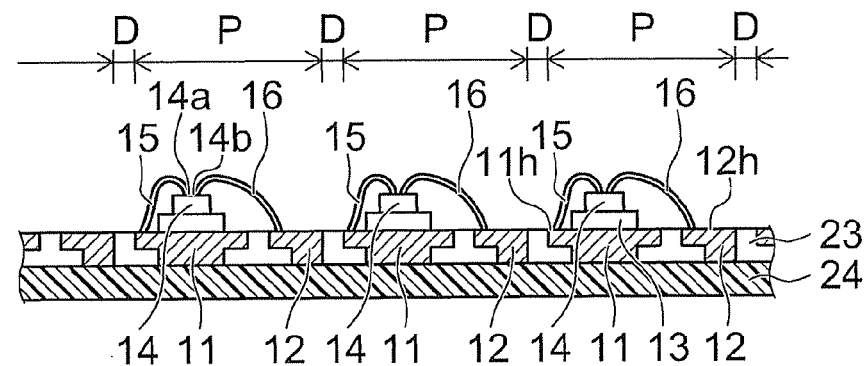

Next, as shown in FIGS. 3 and 4D, by ultrasonic bonding, for example, one end of a wire 15 is bonded to a terminal 14a of the LED chip 14, and the other end of the wire 15 is bonded to an upper surface 11h of the lead frame 11. Moreover, one end of a wire 16 is bonded to a terminal 14b of the LED chip 14, and the other end of the wire 16 is bonded to an upper surface 12h of the lead frame 12. Thus, the terminal 14a is connected to the lead frame 11 through the wire 15, and the terminal 14b is connected to the lead frame 12 through the wire 16.

Figure 5A:
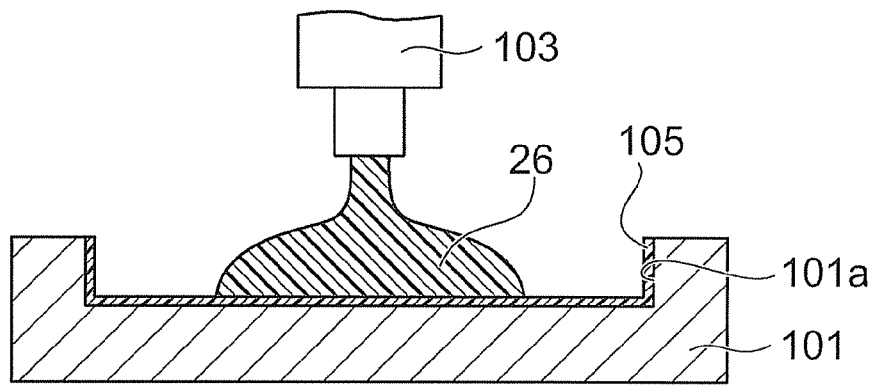

Next, as shown in FIGS. 3 and 5A, a lower mold 101 is prepared. The lower mold 101 and an upper mold 102 described below form a set of molds. In an upper surface of the lower mold 101, a rectangular parallelepiped-shaped recessed portion 101a is formed. Meanwhile, a transparent resin material such as a silicone resin is mixed with phosphors 18 (see FIG. 2A) and stirred to prepare a liquid or semi-liquid phosphor-containing resin material 26. The release sheet 105 is disposed on an inner surface of the recessed portion 101a of the lower mold 101, specifically, on a bottom surface and a side surface. The surface roughness of the release sheet 105 is taken to be 0.15 μm or higher. Next, the phosphor-containing resin material 26 is supplied into the recessed portion 101a of the lower mold 101 with a dispenser 103.

Figure 5B:
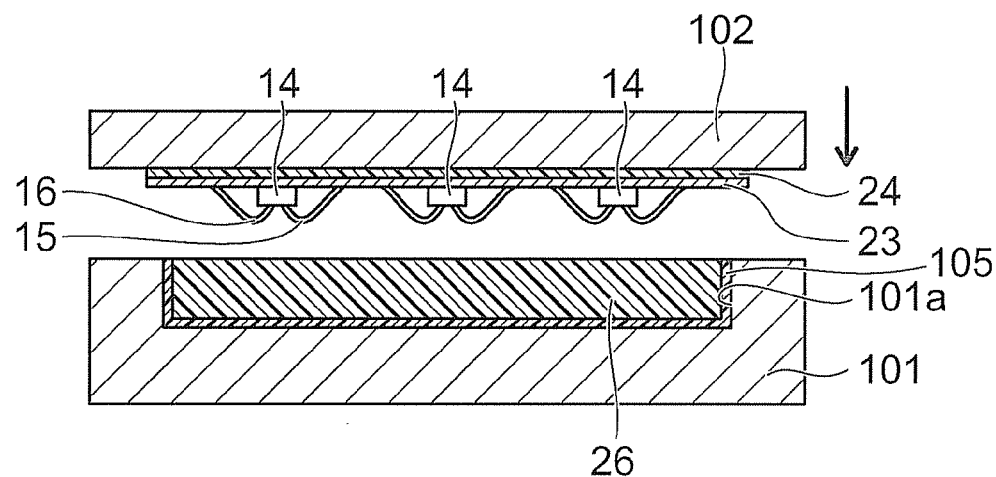

Next, as shown in FIGS. 3 and 5B, the aforementioned lead frame sheet 23 on which the LED chips 14 are mounted is attached on a lower surface of the upper mold 102 in a way that the LED chips 14 face downward. Then, the upper mold 102 is pressed against the lower mold 101, and the molds are clamped. Thereby, the lead frame sheet 23 is pressed against the phosphor-containing resin material 26. In this event, the phosphor-containing resin material 26 covers the LED chips 14, the wires 15 and 16, and enters portions, of the lead frame sheet 23, removed by the etching. In this manner, the phosphor-containing resin material 26 is molded. It is preferable that the mold process is performed in a vacuum atmosphere. This prevents bubbles generated in the phosphor-containing resin material 26 from adhering to portions half-etched in the lead frame sheet 23.

Figure 5C:
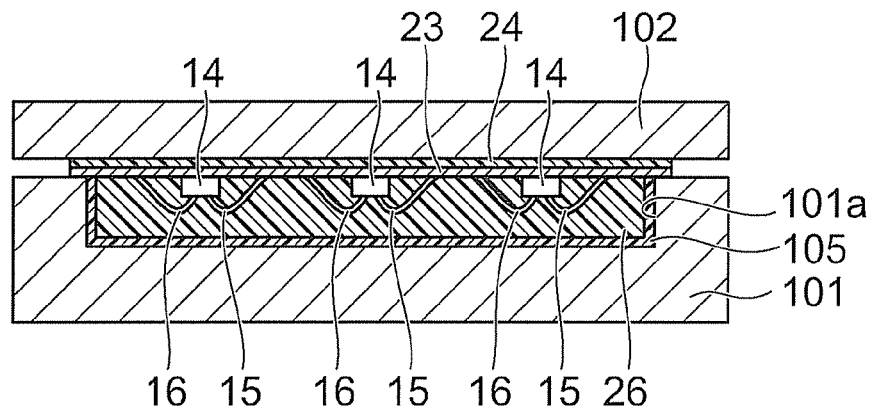
Figure 6A:
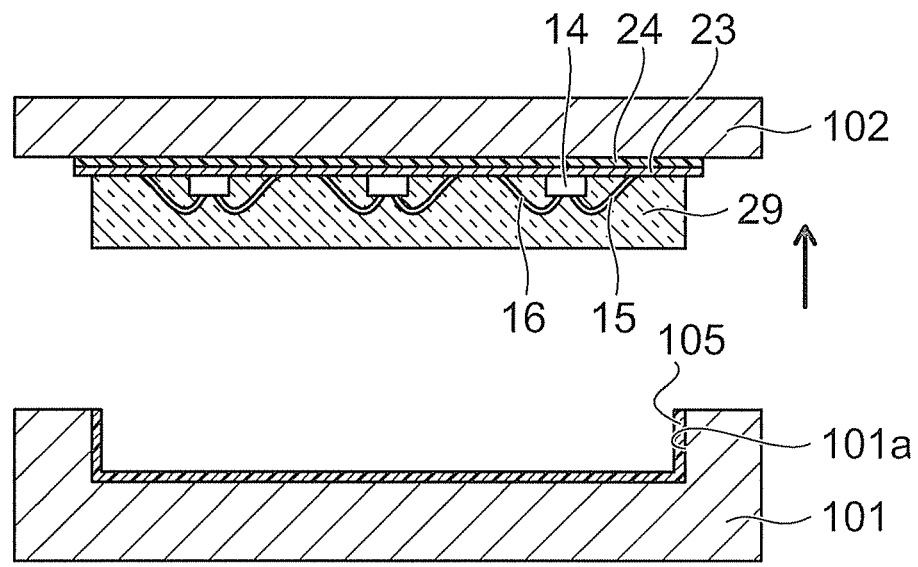

Next, as shown in FIGS. 3 and 5C, with an upper surface of the lead frame sheet 23 being pressed against the phosphor-containing resin material 26, a thermal treatment (mold cure) is performed to cure the phosphor-containing resin material 26. Then, the upper mold 102 is separated from the lower mold 101 as shown in FIG. 6A. Thus, a transparent resin plate 29 is formed on the lead frame sheet 23. The transparent resin plate 29 covers the entire upper surface and a portion of the lower surface of the lead frame sheet 23, and the LED chips 14 and so forth are buried therein. In this event, unevenness of the surface of the release sheet 105 is transferred onto a surface and the surface roughness is 0.15 μm or higher. In the transparent resin plate 29, the phosphors 18 (See FIG. 2A) are dispersed. Subsequently, the reinforcement tape 24 is peeled from the lead frame sheet 23. Thereby, the lower surfaces of the projected portions 11g and 12g of the lead frames 11 and 12 (See FIGS. 2A and 2B) are exposed from the surface of the transparent resin plate 29.

Figure 6B:
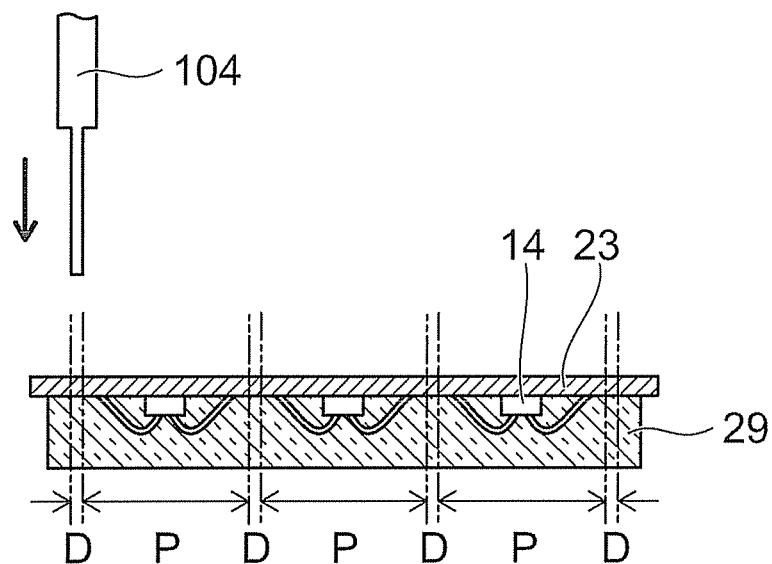

Next, as shown in FIGS. 3 and 6B, with a blade 104, an assembly of the lead frame sheet 23 and the transparent resin plate 29 is diced from a side of the lead frame sheet 23. Specifically, the dicing is performed from the −Z direction side toward the +Z direction. Thereby, portions, of the lead frame sheet 23 and the transparent resin plate 29, disposed in the dicing region D are removed. As a result, portions, of the lead frame sheet 23 and the transparent resin plate 29, disposed in the element regions P are segmented, and thus LED packages 1 shown in FIGS. 1 to 2B are manufactured. Incidentally, the assembly of the lead frame sheet 23 and the transparent resin plate 29 may be diced from a side of the transparent resin body 29.

In each of the LED packages 1 after dicing, the lead frames 11 and 12 are separated from the lead frame sheet 23. Moreover, the transparent resin plate 29 is parted to form transparent resin bodies 17. The upper surface 17a of the transparent resin body 17 has a surface roughness of 0.15 μm or higher. Furthermore, portions, of the dicing region D, extending in the Y direction pass through the openings 23a of the lead frame sheet 23, and extending portions 11d, 11e, 12d, 12e are formed in the lead frames 11 and 12. In addition, the bridges 23b are parted, and extending portions 11b and 11c are formed in the lead frame 11. The bridges 23c are parted, and extending portions 12b and 12c are formed in the lead frame 12. Tip edge surfaces of the extending portions 11b to 11e and 12b to 12e are exposed from side surfaces of the transparent resin body 17

Next, as shown in FIG. 3, the LED package 1 is conveyed from a dicing apparatus to a test apparatus and the various tests are performed. In this event, tip edge surfaces of the extending portions 11b to 11e and 12b to 12e can be used as test terminals.

Next, effects and advantages of this embodiment will be described.

In the LED package 1 according to this embodiment, the upper surface 17a of the transparent resin body 17, which forms the upper surface of the LED package, has a surface roughness of 0.15 μm or higher. For this reason, the LED package 1 is less likely to be attached to another LED package 1. This is presumably because of the increased surface roughness of the transparent resin body 17. The increased surface roughness makes it less likely that a vacuum gap is formed between the transparent resin body 17 and another transparent resin body 17 that comes into contact therewith. Consequently, the two are less likely to be attached to each other. Hence, the LED package 1 is easily handled, also. For example, since the LED packages 1 are less likely to adhere to each other after the aforementioned dicing process, the subsequent test is easily performed. Moreover, the LED package 1 is less likely to be attached also to another member; accordingly, the LED package 1 is easily handled after the test, as well. For example, the LED package 1 is less likely to adhere also to a packing member for holding the LED package 1 during delivery; accordingly, the unpacking operation and the mounting operation are easily performed at the delivery destination, as well.

Not that, since the side surfaces of the transparent resin body 17, which form the side surfaces of the LED package, are surfaces processed by dicing, the surface roughnesses thereof are originally higher than the surface roughness of the upper surface 17a. This makes adhesion to the side surfaces less likely. Moreover, the metallic lead frames 11 and 12 are exposed from the lower surface of the transparent resin body 17, which forms the lower surface of the LED package. This would make adhesion to the lower surface less likely, also. Thus, when the upper surface 17a of the transparent resin body 17 has a surface roughness of 0.15 μm or higher, the adhesiveness of the LED package 1 is significantly reduced, and the handling characteristics are greatly improved.

Hereinafter, the effects will be described based on specific data.

Figure 8:
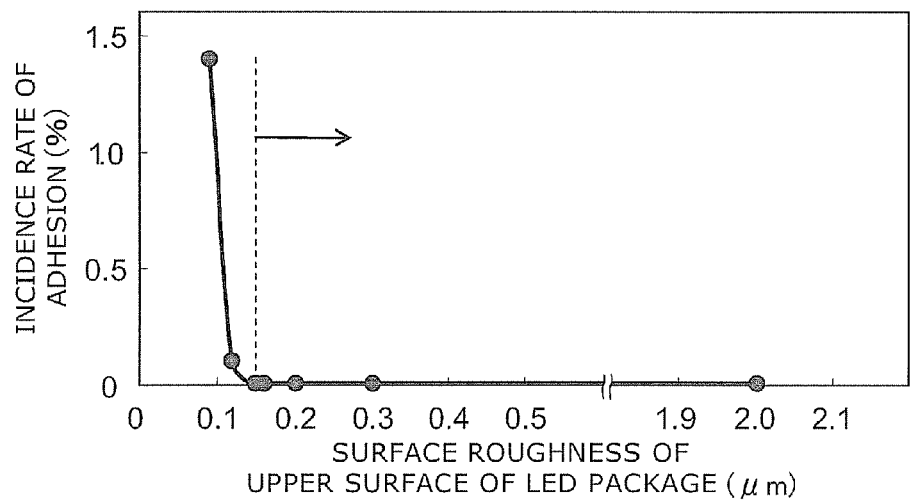
FIG. 8 is a graph illustrating influence of the surface roughness of the upper surface of the transparent resin body on the adhesiveness, with the horizontal axis indicating the surface roughness of the upper surface, and the vertical axis indicating the incidence rate of the adhesion between LED packages.

FIG. 8 is a graph illustrating influence of the surface roughness of the upper surface of the transparent resin body on the adhesiveness, with the horizontal axis indicating the surface roughness of the upper surface, and the vertical axis indicating the incidence rate of the adhesion between LED packages.

FIGS. 9A and 9B are optical micrographs illustrating the upper surface of the transparent resin body in the LED package after manufacturing. FIG. 9A shows the upper surface having a surface roughness of 0.09 μm. FIG. 9B shows the upper surface having a surface roughness of 2.0 μm.

LED packages 1 were manufactured according to the aforementioned method using multiple kinds of the release sheets 105 that had different surface roughnesses from each other. In this event, several thousands of the LED packages 1 were manufactured from one lead frame sheet 33 as mentioned above. Then, whether the LED packages 1 adhered to each other after dicing was observed, and the incident rate was measured. For example, when two LED packages 1 adhere to each other among 100 LED packages 1, the incident rate was calculated to be 2%. This incident rate was plotted on the vertical axis of FIG. 8. Moreover, the surface roughness of the upper surface of the LED package 1 after manufacturing was measured. This measurement result was plotted on the horizontal axis of FIG. 8. Note that, in measuring the surface roughness, when the surface roughness varies depending on the position of the upper surface 17a, the surface roughness is measured at multiple positions of the upper surface 17a, and the average value is adopted. Meanwhile, when the surface roughness varies depending on the measurement direction, the surface roughness is measured along two directions intersecting each other, and the average value is adopted.

As shown in FIG. 8, the greater the surface roughness of the upper surface of the LED package 1, i.e., the upper surface 17a of the transparent resin body 17, the lower the incident rate of the adhesion. Moreover, when the upper surface has a surface roughness of 0.15 μm or higher, no adhesion occurred. As shown in FIG. 9A, the upper surface having a surface roughness of 0.09 μm was smooth. In contrast, as shown in FIG. 9B, the upper surface having a surface roughness of 2.0 μm was like a pearskin finish.

Additionally, in this embodiment, since the surface roughness of the upper surface 17a of the transparent resin body 17 is high, the total reflection of light emitted from the LED chip 14 at the upper surface 17a is suppressed. Thus, the light extraction efficiency is improved. This effect is particularly noticeable when an LED package includes no phosphor 18 dispersed in the transparent resin body 17 and emits single-color light.

Next, effects and advantages other than the above of this embodiment will be described.

In the LED package 1 according to this embodiment, no enclosure made of a white resin is provided. Accordingly, no enclosure is degraded by absorbing light and heat generated from the LED chip 14. Particularly, when an enclosure is formed of a thermoplastic polyamide resin, the resin is likely to be degraded. In this embodiment, however, there is no problem of such degradation. For this reason, the LED package 1 according to this embodiment has a high durability. Thus, the LED package 1 according to this embodiment has a long life and a high reliability, and is applicable in wide usage.

Furthermore, in the LED package 1 according to this embodiment, no enclosure for covering a side surface of the transparent resin body 17 is provided. Accordingly, light is emitted at a wide angle. For this reason, the LED package 1 according to this embodiment is advantageously used when light needs to be emitted at a wide angle, for example, used for illumination and as a backlight of a liquid crystal television.

Still furthermore, in the LED package 1 according to this embodiment, the transparent resin body 17 covers portions of the lower surfaces and large portions of the edge surfaces of the lead frames 11 and 12, and holds peripheral portions of the lead frames 11 and 12. In this manner, the lower surfaces of the projected portions 11g and 12g of the lead frames 11 and 12 are exposed from the transparent resin body 17, and external electrode pads are formed; moreover, the holdability for the lead frames 11 and 12 is increased. Specifically, by forming the projected portions 11g and 12g on the central portions, in the X direction, of the base portions 11a and 12a, indentations are formed at two edge portions, in the X direction, of each lower surface of the base portions 11a and 12a. The transparent resin body 17 goes around and into the indentations to strongly hold the lead frames 11 and 12. This makes the lead frames 11 and 12 hardly detached from the transparent resin body 17 in dicing, and the yield of the LED package 1 is improved. Moreover, this can prevent that lead frames 11 and 12 detach from the transparent resin body 17 by temperature stress in using the LED package 1.

Still furthermore, in the LED package 1 according to this embodiment, the silver plated layers are formed on the upper and lower surfaces of the lead frames 11 and 12. Since silver plated layers have a high light reflectivity, the LED package 1 according to this embodiment has a high light extraction efficiency.

Still furthermore, in this embodiment, from the single conductive sheet 21, a large number, for example, approximately several thousands, of the LED packages 1 can be manufactured at once. Thus, the manufacturing cost per LED package is reduced. In addition, since no enclosure is provided, the numbers of components and processes are small, and the cost is low.

Still furthermore, in this embodiment, the lead frame sheet 23 is formed by wet-etching. For this reason, when an LED package of novel layout is manufactured, only the original plates of the masks need to be prepared. The initial cost is suppressed to a lower extent than a case where a lead frame sheet 23 is formed by a method such as pressing with a mold.

Still furthermore, in the LED package 1 according to this embodiment, the extending portions are extended from the base portions 11a and 12a of the lead frames 11 and 12. Thus, the base portions themselves are prevented from being exposed from the side surfaces of the transparent resin body 17, and the exposed areas of the lead frames 11 and 12 are reduced. Moreover, the contact area between lead frames 11 and 12 and the transparent resin body 17 can be made to increase. As a result, the lead frames 11 and 12 are prevented from being detached from the transparent resin body 17. Moreover, corrosion of the lead frames 11 and 12 is also suppressed.

The effects will be considered from the viewpoint of the manufacturing method. The openings 23a and the bridges 23b and 23c are provided in the lead frame sheet 23 in a way that the openings 23a and the bridges 23b and 23c exist within the dicing region D as shown in FIG. 7B. Thereby, the amount of metal portion within the dicing region D is reduced. Thus, dicing is performed easily, and wearing of the dicing blade is suppressed. Moreover, in this embodiment, from each of the lead frames 11 and 12, four extending portions are extended in three directions. Thus, in the process of mounting the LED chip 14 shown in FIG. 4C, a lead frame 11 is surely supported in three directions by lead frames 11 and 12 in adjacent element regions P, and the mountability is high. Similarly, in the wire bonding process shown in FIG. 4D also, bonding positions of the wires are surely supported in the three directions. Accordingly, the ultrasound applied in the ultrasonic bonding scarcely escapes, and the wires are favorably bonded to the lead frames and the LED chip.

Still furthermore, in the dicing process shown in FIG. 6B of this embodiment, the dicing is performed from the lead frame sheet 23 side. Thereby, the metal material forming the end portions of the lead frames 11 and 12 subjected to cutting stretches in the +Z direction on the side surface of the transparent resin body 17. For this reason, this metal material never stretches in the −Z direction on the side surface of the transparent resin body 17, nor protrudes from the lower surface of the LED package 1; hence, no burr is formed. Thus, when the LED package 1 is mounted, mounting failure due to a burr never happens.

Next, a variation of this embodiment will be described.

This variation is a variation of a method for forming a lead frame sheet.

Specifically, in this variation, the method for forming a lead frame sheet shown in FIG. 4A is different from that in the above-described first embodiment.

FIGS. 10A to 10H are process sectional views illustrating the method for forming the lead frame sheet of this variation.

Figure 10A:
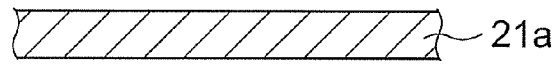
FIGS. 10A to 10H are process sectional views illustrating a method for forming a lead frame sheet of a variation of the first embodiment.
Figure 10B:
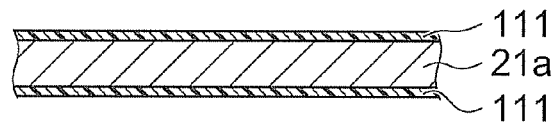
Figure 10C:
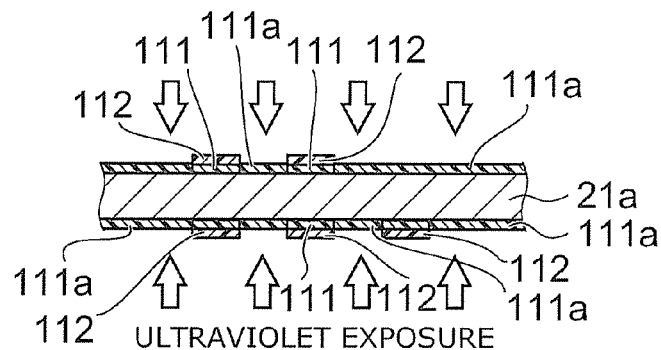
Figure 10D:
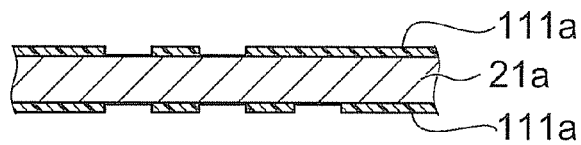
Figure 10E:
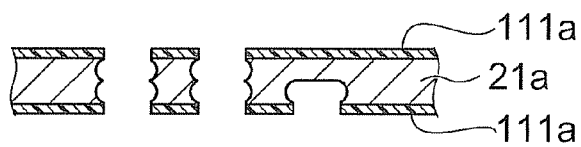
Figure 10F:
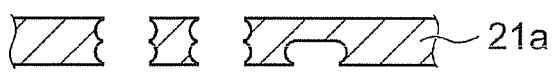
Figure 10G:
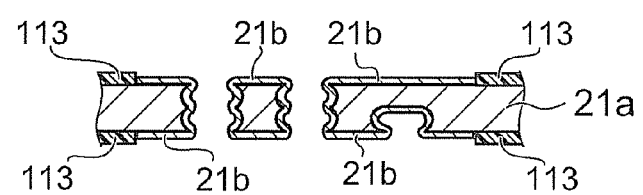
Figure 10H:
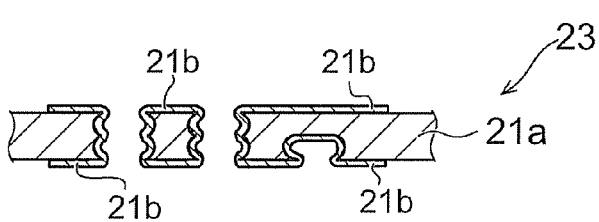

First, a copper plate 21a is prepared as shown in FIG. 10A, and cleaned. Next, as shown in FIG. 10B, both surfaces of the copper plate 21a are coated with a resist and then dried to form resist films 111. Next, as shown in FIG. 10C, mask patterns 112 are disposed on the resist films 111, and subjected to exposure with ultraviolet irradiation. Thereby, exposed portions of the resist films 111 are cured, and resist masks 111a are formed. Next, as shown in FIG. 10D, development is performed, and non-cured portions of the resist films 111 are washed away. Thereby, the resist patterns 111a are left remained on the upper and lower surfaces of the copper plate 21a. Next, as shown in FIG. 10E, using the resist patterns 111a as masks, etching is performed to remove exposed portions of the copper plate 21a from both surfaces. In this event, the etching depth is approximately half the thickness of the copper plate 21a. Thereby, a region etched only from one surface side is half-etched, while a region etched from both surface sides is penetrated. Next, as shown in FIG. 10F, the resist patterns 111a are removed. Next, as shown in FIG. 10G, end portions of the copper plate 21a are covered with masks 113, and then plated. Thereby, silver plated layers 21b are formed on surfaces of portions, other than the end portions, of the copper plate 21. Next, as shown in FIG. 10H, the resultant is cleaned, and the masks 113 are removed. After that, inspection is performed. In this manner, a lead frame sheet 23 is formed. Configuration, manufacturing method, effects, and advantages, other than the above, of this variation are the same as those of the above-described first embodiment.

Next, a second embodiment will be described.

Figure 11:
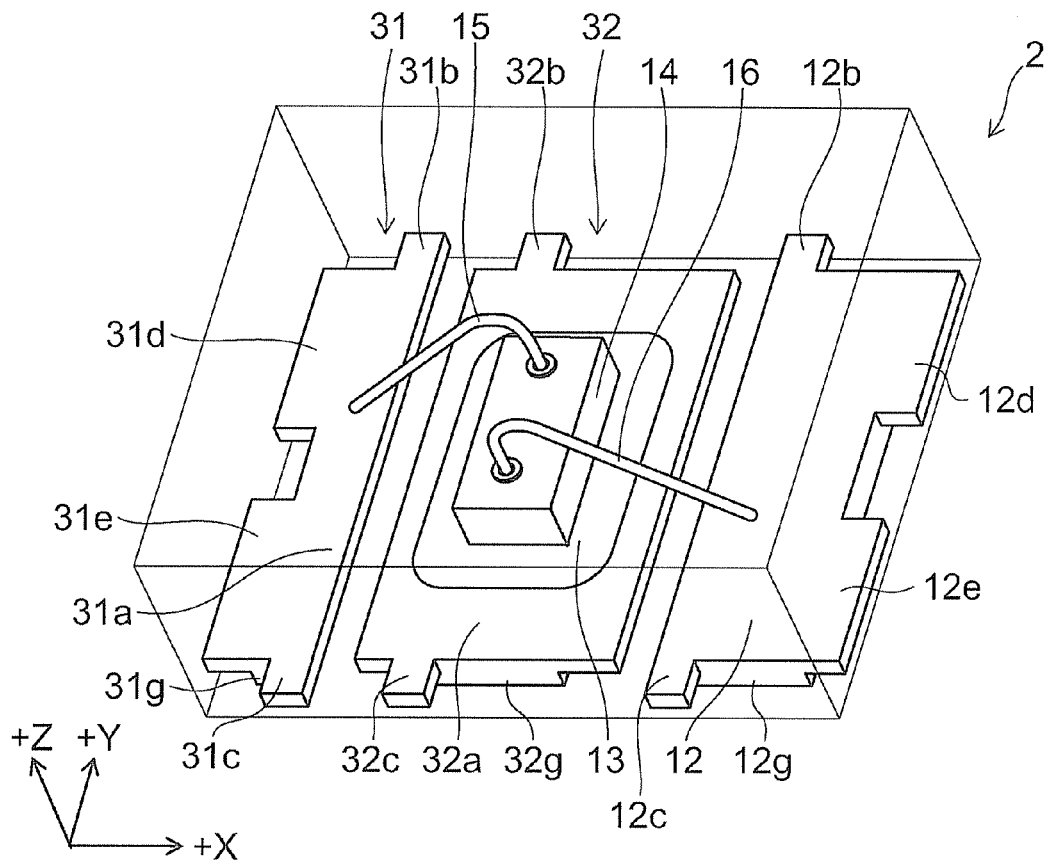
FIG. 11 is a perspective view illustrating an LED package according to a second embodiment.

FIG. 11 is a perspective view illustrating an LED package according to this embodiment.

Figure 12:
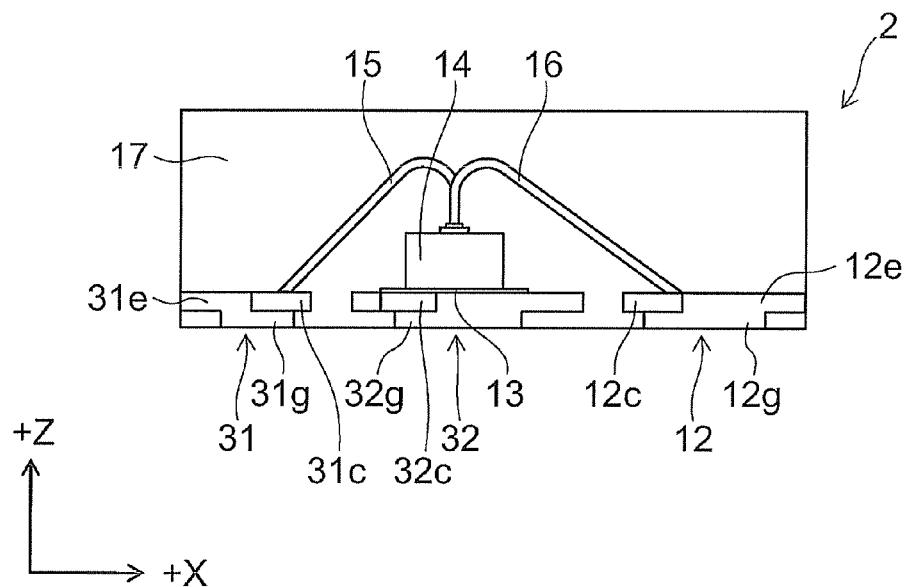
FIG. 12 is a side view illustrating the LED package according to the second embodiment.

FIG. 12 is a side view illustrating the LED package according to this embodiment.

As shown in FIGS. 11 and 12, a LED package 2 according to this embodiment is different from the above-described LED package 1 according to the first embodiment (see FIG. 1) in that the lead frame 11 (see FIG. 1) is divided in the X direction into two lead frames 31 and 32. The lead frame 32 is disposed between the lead frame 31 and the lead frame 12. Extending portions 31d and 31e corresponding to the extending portions 11d and 11e of the lead frame 11 (see FIG. 1) are formed on the lead frame 31. Extending portions 31b and 31c extending respectively in the +Y direction and the −Y direction are formed from a base portion 31a. The positions of the extending portions 31b and 31c correspond to each other in the X direction. Furthermore, the wire 15 is bonded to the lead frame 31. Meanwhile, extending portions 32b and 32c corresponding to the extending portions 11b and 11c of the lead frame 11 (see FIG. 1) are formed on the lead frame 32. The LED chip 14 is mounted on the lead frame 32 with the die mounting material 13 interposed therebetween. Moreover, projected portions corresponding to the projected portion 11g of the lead frame 11 are formed on the lead frames 31 and 32 in a divided manner as projected portions 31g and 32g, respectively.

In this embodiment, the lead frames 31 and 12 function as external electrodes when a potential is applied from the outside. Meanwhile, no potential needs to be applied to the lead frame 32. The lead frame 32 can be used as a lead frame dedicated as a heat sink. Thus, when multiple LED packages 2 are mounted on one module, lead frames 32 can be connected to a common heat sink. Incidentally, a ground potential may be applied to the lead frame 32, or the lead frame 32 may be in the state of floating. Moreover, when the LED package 2 is mounted on a motherboard, a so-called Manhattan phenomenon can be suppressed by bonding solder balls to each of the lead frame 31, 32 and 12. The Manhattan phenomenon refers to a phenomenon that when a device or the like is mounted on a board with multiple solder balls or the like interposed therebetween, the device stands up due to different melting timing of the solder balls in a reflow furnace and the surface tension of the solder. This phenomenon causes mounting failure. In this embodiment, the lead frame layout is symmetrical with respect to the X direction, and the solder balls are densely disposed in the X direction; thereby, the Manhattan phenomenon is less likely to occur.

Moreover, in this embodiment, the lead frame 31 is supported by the extending portions 31b to 31e in three directions. Accordingly, the wire 15 is favorably bonded. Similarly, since the lead frame 12 is supported by the extending portions 12b to 12e in three directions, the wire 16 is favorably bonded.

Such an LED package 2 can be manufactured by a similar method to that in the above-described first embodiment, if the basic pattern of the element regions P of the lead frame sheet 23 is altered in the above-described process shown in FIG. 4A. Specifically, LED packages of various layouts can be manufactured only by altering the patterns of the masks 22a and 22b according to the manufacturing method described in the above-described first embodiment. Configuration, manufacturing method, effects, and advantages, other than the above, of this embodiment are the same as those of the above-described first embodiment.

Next, a third embodiment will be described.

Figure 13:
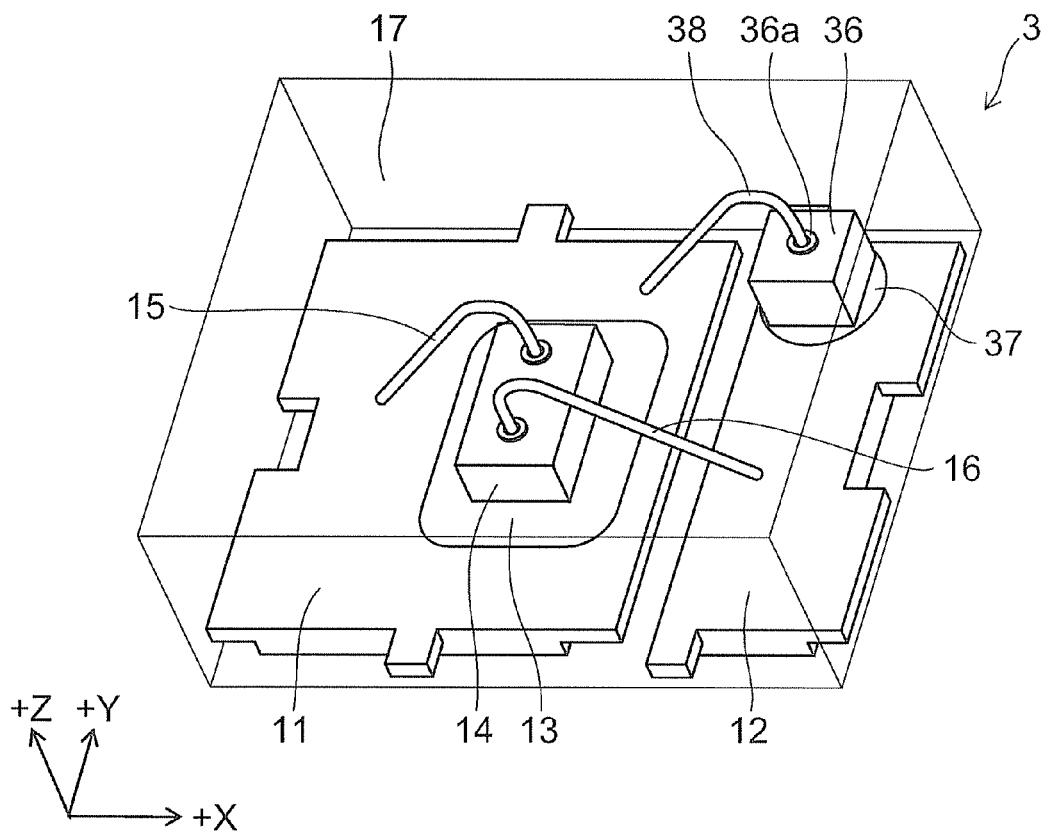
FIG. 13 is a perspective view illustrating an LED package according to a third embodiment.

FIG. 13 is a perspective view illustrating an LED package according to this embodiment.

Figure 14:
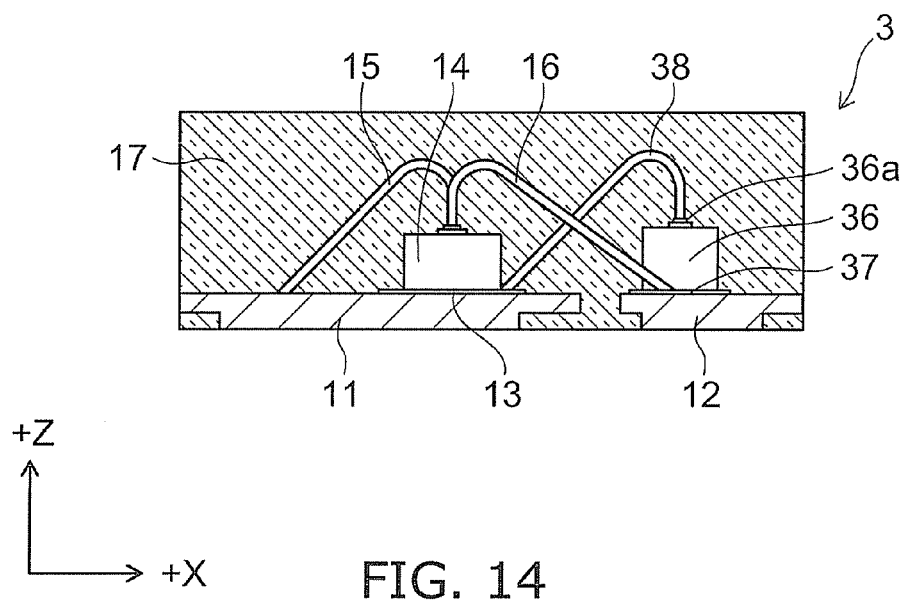
FIG. 14 is a cross-sectional view illustrating the LED package according to the third embodiment.

FIG. 14 is a cross-sectional view illustrating the LED package according to this embodiment.

As shown in FIGS. 13 and 14, an LED package 3 according to this embodiment includes a Zener diode chip 36 and so forth in addition to the configuration of the LED package (see FIG. 1) according to the above-described first embodiment. The Zener diode chip 36 is connected between the lead frame 11 and the lead frame 12. Specifically, a die mounting material 37 made of a conductive material such as a silver paste or solder is attached onto an upper surface of the lead frame 12, and the Zener diode chip 36 is provided on the die mounting material 37. Thus, the Zener diode chip 36 is mounted on the lead frame 12 with the die mounting material interposed therebetween, and a lower surface terminal (unillustrated) of the Zener diode chip 36 is connected to the lead frame 12 with the die mounting material 37. Moreover, an upper surface terminal 36a of the Zener diode chip 36 is connected to the lead frame 11 through a wire 38. Specifically, one end of the wire 38 is connected to the upper surface terminal 36a of the Zener diode chip 36, and the wire 38 is led out from the upper surface terminal 36a in the +Z direction and curved in a direction between the −Z direction and the −X direction. The other end of the wire 38 is bonded to an upper surface of the lead frame 11.

Thus, in this embodiment, the Zener diode chip 36 is connected in parallel to the LED chip 14. As a result, the durability for electrostatic discharge (ESD) is improved. Configuration, manufacturing method, effects, and advantages, other than the above, of this embodiment are the same as those of the above-described first embodiment.

Next, a fourth embodiment will be described.

Figure 15:
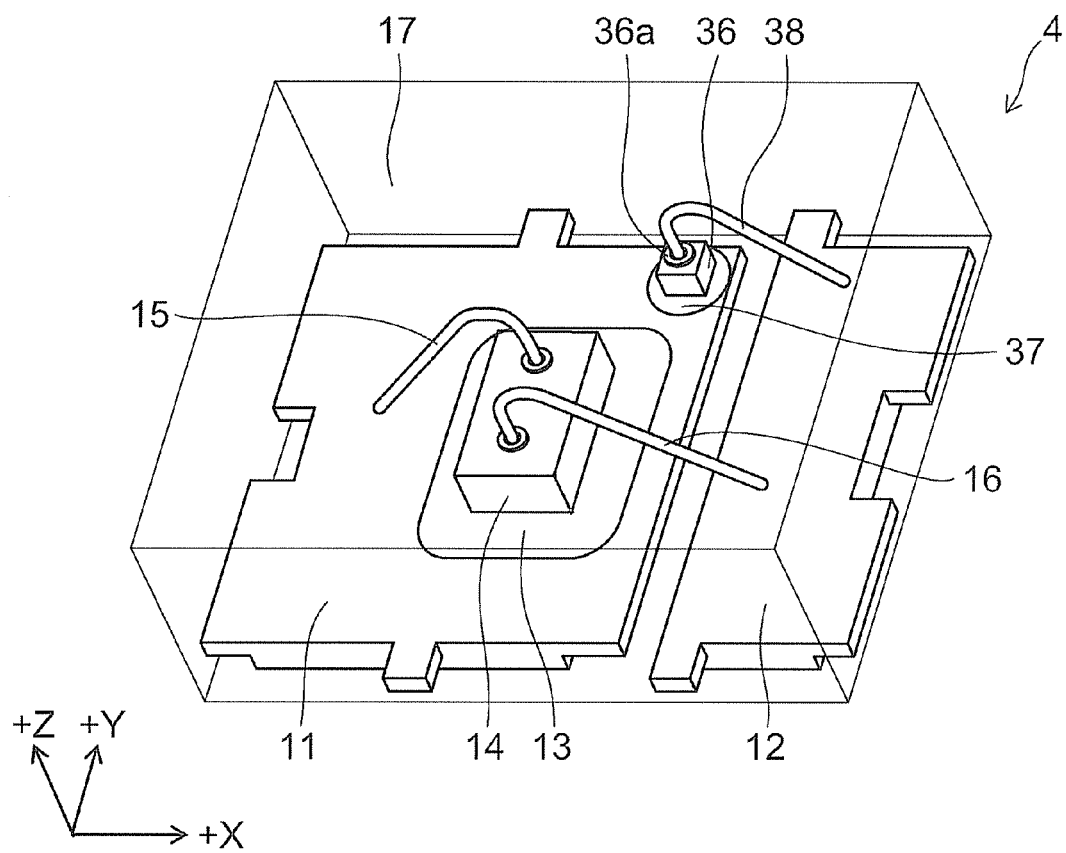
FIG. 15 is a perspective view illustrating an LED package according to a fourth embodiment.

FIG. 15 is a perspective view illustrating an LED package according to this embodiment.

Figure 16:
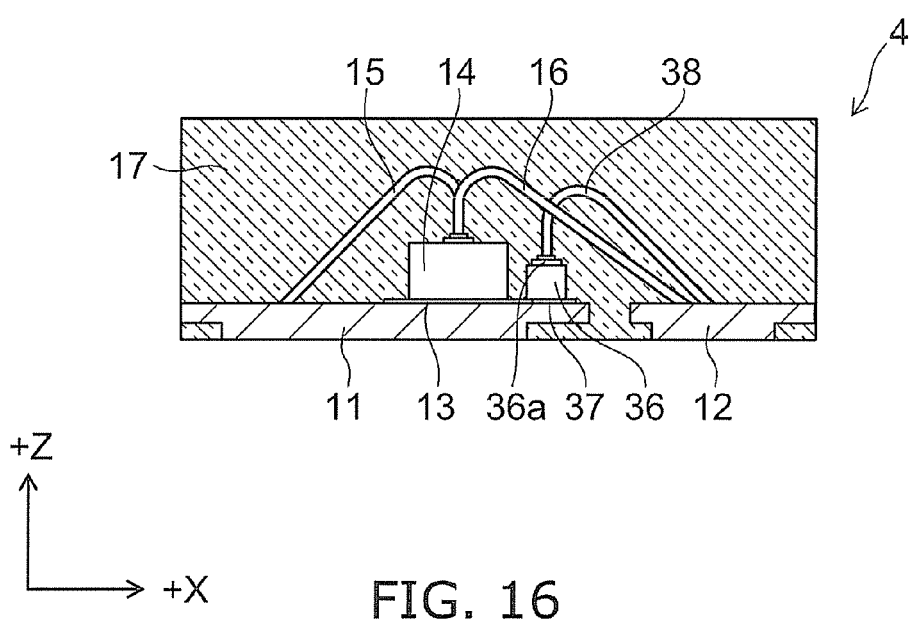
FIG. 16 is a cross-sectional view illustrating the LED package according to the fourth embodiment.

FIG. 16 is a cross-sectional view illustrating the LED package according to this embodiment.

As shown in FIGS. 15 and 16, an LED package 4 according to this embodiment is different from the above-described LED package 3 (see FIG. 13) according to the third embodiment in that the Zener diode chip 36 is mounted on the lead frame 11. In this case, the lower surface terminal of the Zener diode chip 36 is connected to the lead frame 11 with the die mounting material 37 interposed therebetween, and the upper surface terminal is connected to the lead frame 12 through the wire 38. Configuration, manufacturing method, effects, and advantages, other than the above, of this embodiment are the same as those of the above-described third embodiment.

Next, a fifth embodiment will be described.

Figure 17:
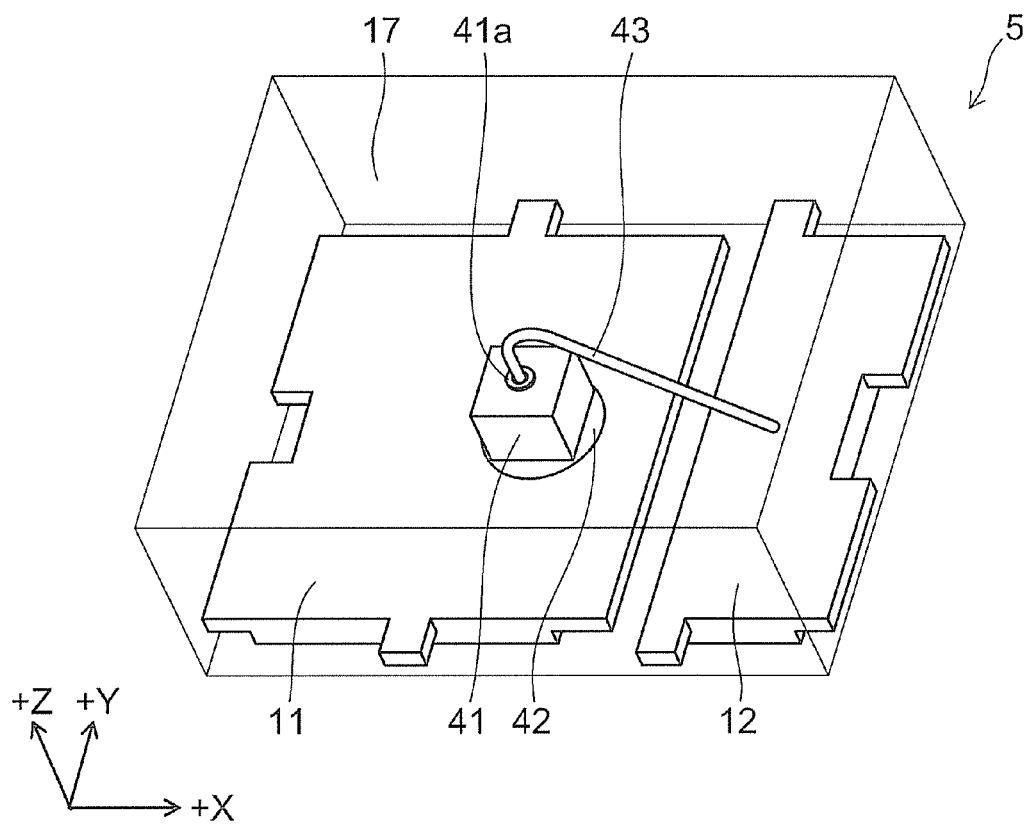
FIG. 17 is a perspective view illustrating an LED package according to a fifth embodiment.

FIG. 17 is a perspective view illustrating an LED package according to this embodiment.

Figure 18:
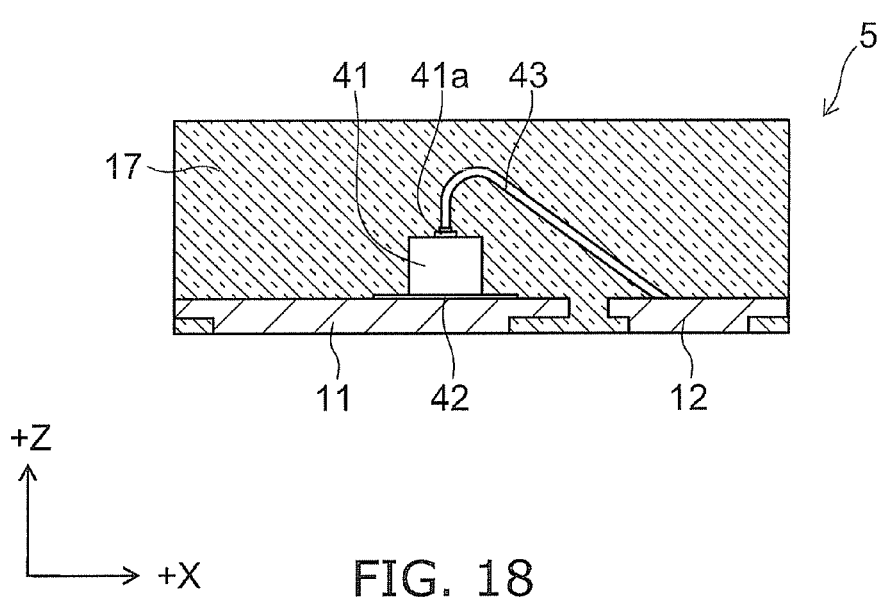
FIG. 18 is a cross-sectional view illustrating the LED package according to the fifth embodiment.

FIG. 18 is a cross-sectional view illustrating the LED package according to this embodiment.

As shown in FIGS. 17 and 18, an LED package 5 according to this embodiment is different from the above-described LED package 1 (see FIG. 1) according to the first embodiment in that an LED chip 41 of vertical conduction type is provided instead of the LED chip 14 of upper surface terminal type. Specifically, in the LED package 5 according to this embodiment, a die mounting material 42 made of a conductive material such as a silver paste or solder is formed on an upper surface of the lead frame 11. The LED chip 41 is mounted on the lead frame 11 with the die mounting material 42 interposed therebetween. A lower surface terminal (unillustrated) of the LED chip 41 is connected to the lead frame 11 through the die mounting material 42. Meanwhile, an upper surface terminal 41a of the LED chip 41 is connected to the lead frame 12 through a wire 43.

In this embodiment, the LED chip 41 of vertical conduction type is adopted, and the number of wires is one. This surely prevents contacting of wires, and simplifies the wire bonding process. Configuration, manufacturing method, effects, and advantages, other than the above, of this embodiment are the same as those of the above-described first embodiment.

Next, a sixth embodiment will be described.

Figure 19:
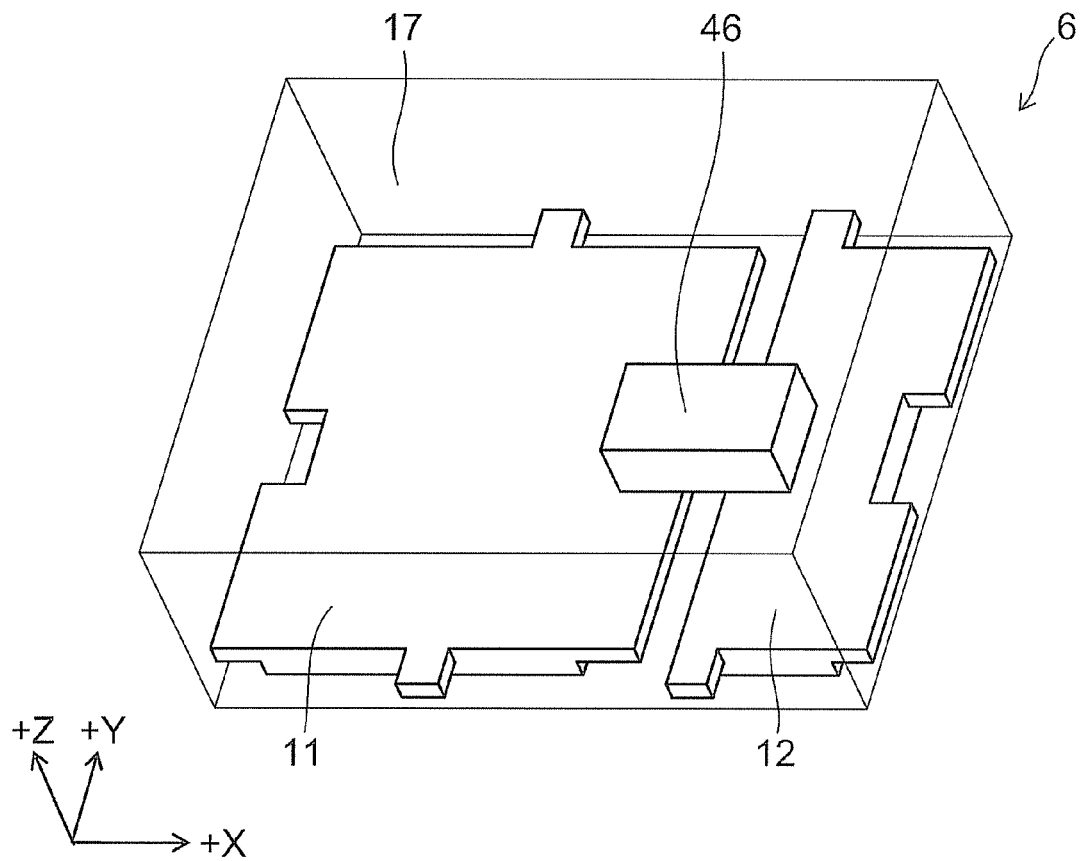
FIG. 19 is a perspective view illustrating an LED package according to a sixth embodiment.

FIG. 19 is a perspective view illustrating an LED package according to this embodiment.

Figure 20:
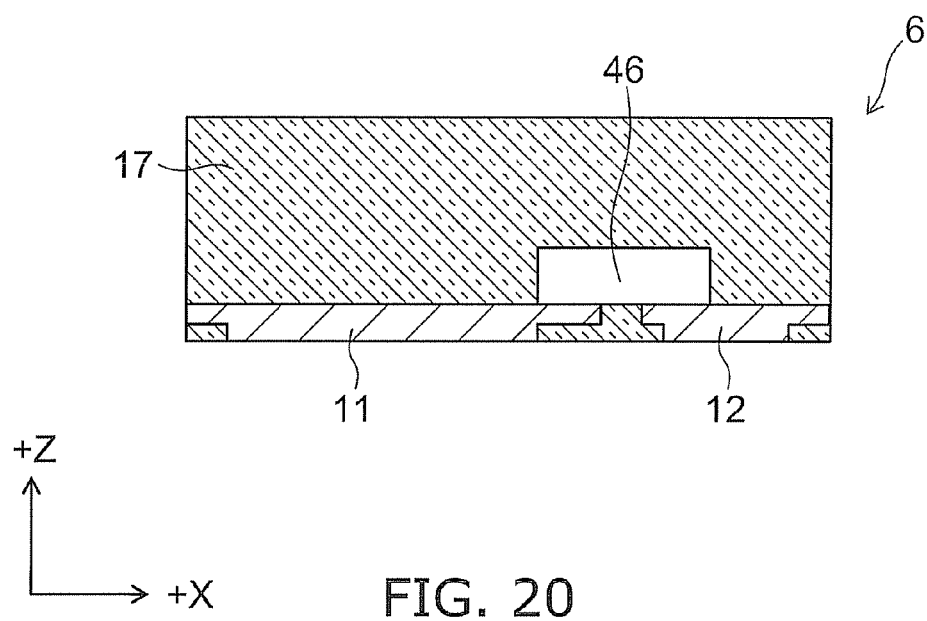
FIG. 20 is a cross-sectional view illustrating the LED package according to the sixth embodiment.

FIG. 20 is a cross-sectional view illustrating the LED package according to this embodiment.

As shown in FIGS. 19 and 20, an LED package 6 according to this embodiment is different from the above-described LED package 1 (see FIG. 1) according to the first embodiment in that an LED chip 46 of flip type is provided instead of the LED chip 14 of upper surface terminal type. Specifically, in the LED package 6 according to this embodiment, two terminals are provided on a lower surface of the LED chip 46. Moreover, the LED chip 46 is disposed like a bridge so as to straddle the lead frame 11 and the lead frame 12. One of the lower surface terminals of the LED chip 46 is connected to the lead frame 11, and the other lower surface terminal is connected to the lead frame 12.

In this embodiment, the LED chip 46 of flip type is adopted and no wire is used. This increases the light extraction efficiency in the upward direction, and helps to omit 3o the wire bonding process. Moreover, rupturing of a wire due to thermal stress of the transparent resin body 17 is also prevented. Configuration, manufacturing method, effects, and advantages, other than the above, of this embodiment are the same as those of the above-described first embodiment.

The LED package according to the invention is not limited to the above-described first to sixth embodiments. Each of the above-described embodiments can be implemented in combination with the other embodiments. Moreover, those obtained through design alteration, addition, or deletion of the components, or those obtained through condition alteration, addition, or omission of the processes, which will be made appropriately on the above-described first to sixth embodiments by those skilled in the art are included in the scope of the invention, as long as such variations include the gist of the invention.

For example, in the above-described first embodiment, an example has been shown that the surface roughness of the upper surface 17a is controlled in a manner of transferring the unevenness of the surface of the release sheet 105 onto the upper surface 17a of the transparent resin body 17. However, the invention is not limited thereto. Any method may be adopted to roughen the surface of the upper surface 17a. For example, the upper surface 17a may be roughened by performing liquid honing on the LED package 1 after dicing. Alternatively, the phosphor-containing resin material 26 may be supplied on the release sheet having a smooth surface, the release sheet being disposed on the bottom surface of the recessed portion 101a of the lower mold 101, the bottom surface having a surface roughness of 0.15 μm or higher. In this manner also, the upper surface 17a can be roughened.

For example, in the above-described first embodiment, an example has been shown that the lead frame sheet 23 is formed by wet-etching. However, the invention is not limited thereto. For example, the lead frame sheet 23 may be formed in a mechanical way such as pressing. Moreover, in the above-described first to sixth embodiments, examples have been shown that one LED chip is mounted on one LED package. However, the invention is not limited thereto. Multiple LED chips may be mounted on one LED package. Furthermore, a groove may be formed on the upper surface of the lead frame between a region where a die mounting material is to be formed and a region where a wire is to be bonded. Alternatively, a recessed portion may be formed on the upper surface of the lead frame in a region where a die mounting material is to be formed. Thereby, even if the supply amount or supply position of the die mounting material varies, the die mounting material is prevented from flowing out to the region where the wire is to be bonded, and the wire bonding is prevented from being inhibited.

Still furthermore, in the above-described first embodiment, an example has been shown that the lead frame is a copper plate and a silver plated layer formed on the upper and lower surfaces of the copper plate. However, the invention is not limited thereto. For example, a rhodium (Rh) plated layer may be formed on at least one of silver plated layers respectively formed on the upper and lower surfaces of a copper plate. Alternatively, a copper (Cu) plated layer may be formed between a copper plate and a silver plated layer. Furthermore, a gold-silver alloy (Au—Ag alloy) plated layer may be formed on a nickel (Ni) plated layer formed on each of the upper and lower surfaces of a copper plate.

Still furthermore, in the above-described embodiments, examples have been shown that the LED chip is a chip which emits blue light, that the phosphor is a phosphor which absorbs blue color and emits yellow light, and that the color of light emitted from the LED package is white. However, the invention is not limited thereto. The LED chip may emit visible light of any color other than blue, or may emit ultraviolet light or infrared radiation. The phosphor is not limited to the phosphor which emits yellow light. For example, the phosphor may emit blue light, green light, or red light. Moreover, the light emitted from the LED chip may be emitted directly from the LED package without providing the phosphor.

Still furthermore, in the above-described embodiments, examples have been shown that the base portion of the lead frame has a rectangular shape when seen from above. However, the base portion may have a shape that at least one corner thereof is cut off. Thereby, the corner of the lead frame with a right angle or an acute angle is not provided around corners of the LED package. And the chamfered corner will not serve as the origin of resin peeling and crack of the transparent resin body. As a result, the incidences of resin peeling and crack are suppressed in the LED package as a whole.

According to the above-described first to sixth embodiments, an LED package easy to handle and a method for manufacturing the LED package are provided.

Next, a seventh embodiment will be described.

The seventh embodiment to a tenth embodiment are embodiments of a packing member for an LED package.

Figure 21:
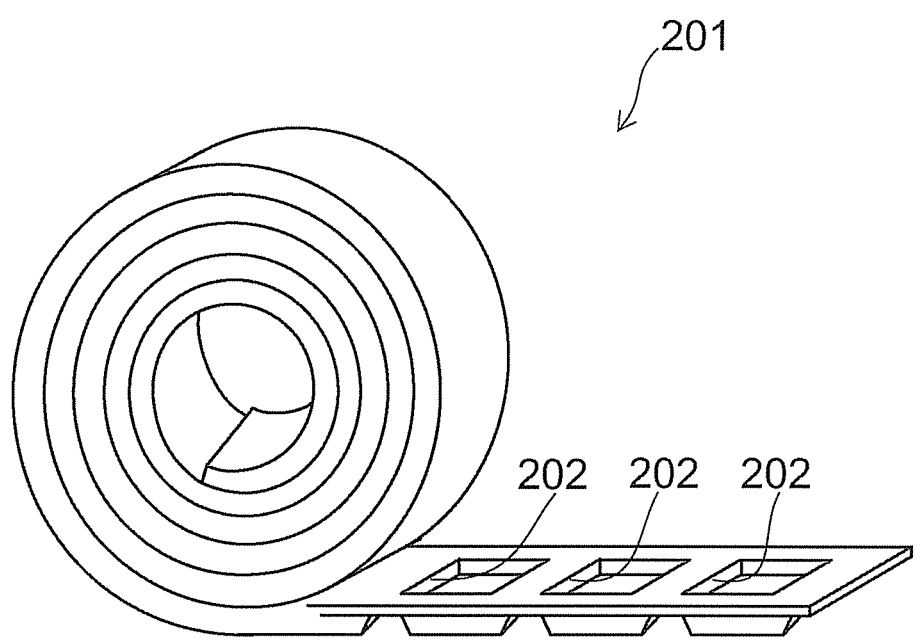
FIG. 21 is a perspective view illustrating a packing member for an LED package according to a seventh embodiment.

FIG. 21 is a perspective view illustrating a packing member for an LED package according to this embodiment.

Figure 22:
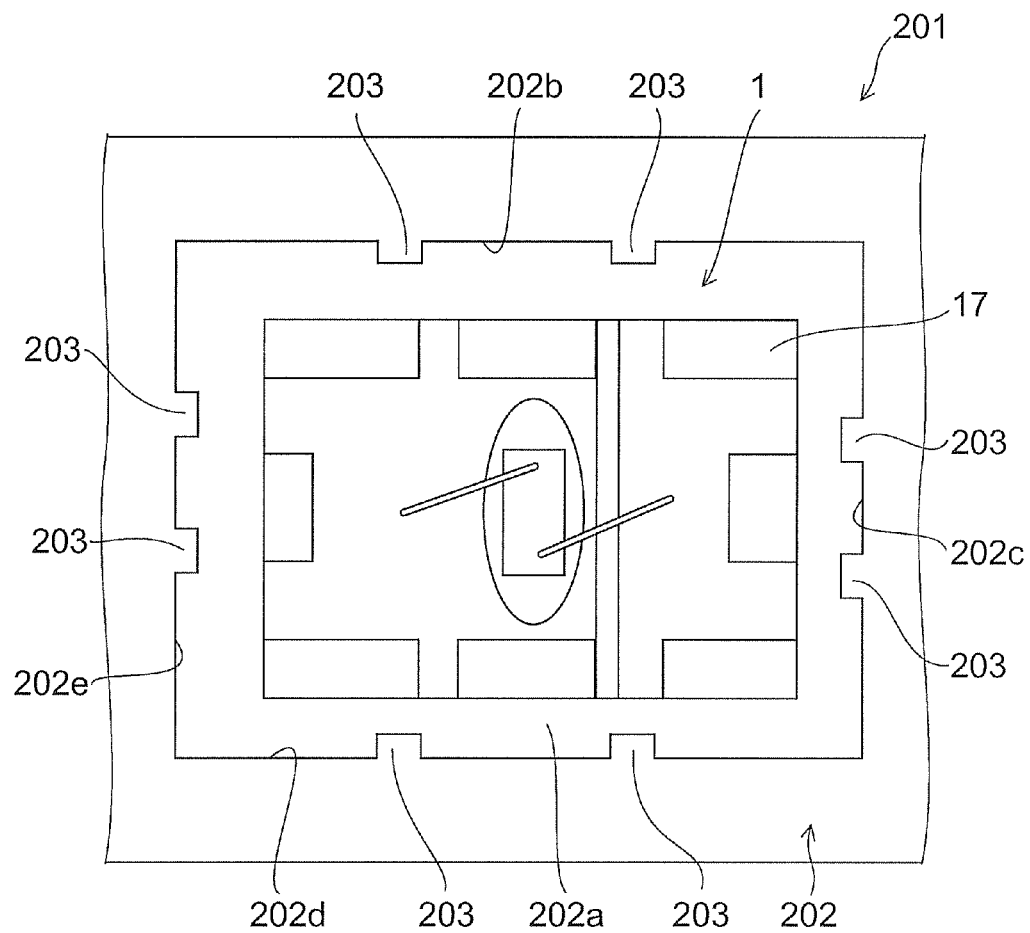
FIG. 22 is a plan view illustrating one recessed portion of the packing member for the LED package according to the seventh embodiment.

FIG. 22 is a plan view illustrating one recessed portion of the packing member for the LED package according to this embodiment.

Figure 23:
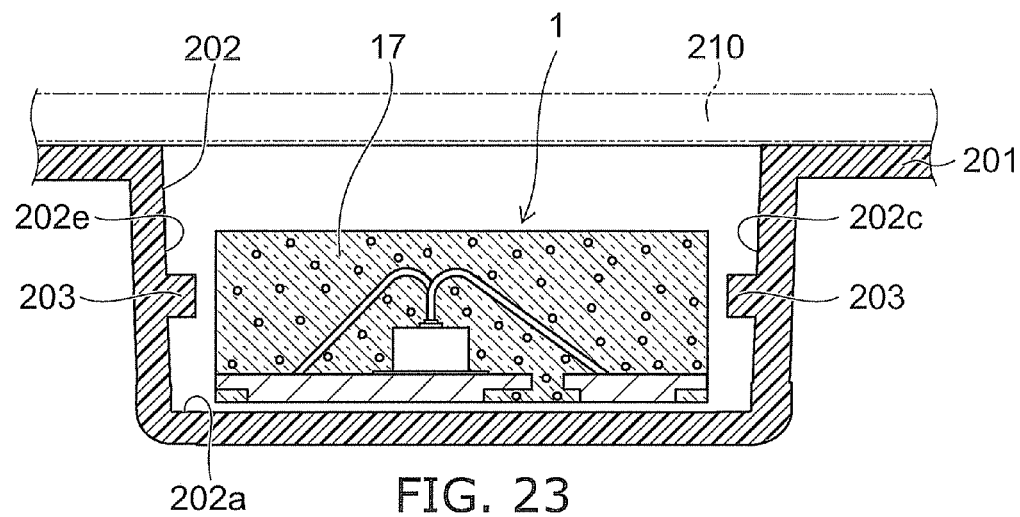
FIG. 23 is a cross-sectional view illustrating one recessed portion of the packing member for the LED package according to the seventh embodiment.

FIG. 23 is a cross-sectional view illustrating the recessed portion of the packing member for the LED package according to this embodiment.

A packing member 201 for an LED package according to this embodiment is to locate an LED package as described in the above-described first to sixth embodiments. This embodiment shows an example of housing the LED package 1 according to the above-described first embodiment. However, the LED package that can be located is not limited to ones shown in the above-described first to sixth embodiments. For example, in the LED package, an upper surface of the transparent resin body may have a surface roughness lower than 0.15 μm.

As shown in FIG. 21, the packing member 201 is, for example, a carrier tape. The packing member 201 has a belt-like shape, and is normally used while wound around a reel (unillustrated). Multiple recessed portions 202 are formed in one surface of the packing member 201. The recessed portions 202 are arranged in one row along a direction in which the packing member 201 extends. The packing member 201 is formed of, for example, a resin material such as a polystyrene, polycarbonate, polyester, or vinyl chloride. Alternatively, the packing member 201 may be formed of paper. Carbon (C) may be added in order to impart conductivity to the packing member 201.

As shown in FIGS. 22 and 23, the recessed portion 202 has a substantially rectangular parallelepiped shape. The recessed portion 202 is formed of one substantially rectangular bottom surface 202a when seen from above, and four side surfaces 202b to 202e. Two projected portions 203 are formed at each of the side surfaces 202b to 202e. The projected portions 203 are arranged along a direction parallel to the surface of the packing member 201. Thereby, unevenness is formed on each of the side surfaces 202b to 202e. The unevenness is greater than unevenness formed on a side surface of the LED package 1, i.e., a side surface of the transparent resin body 17.

Next, a method for using the packing member for an LED package according to this embodiment configured as mentioned above, i.e., a method for conveying an LED package according to this embodiment, will be described.

In this embodiment, while a packing member 201 that is a carrier tape is transferred from one reel to another reel, each LED package 1 is individually located into one recessed portion 202 of the packing member 201. In this event, the LED package 1 is disposed upward, and a lower surface of the LED package 1 faces a bottom surface 202a of the recessed portion 202. Side surfaces of the LED package 1 face side surfaces 202b to 202e of the recessed portion 202. Next, a cover tape 210 covers an upper end portion of the recessed portion 202 to seal the inside of the recessed portion 202.

Then, the packing member 201 and the cover tape 210 are conveyed while wound onto the reel, for example.

Next, effects and advantages of this embodiment will be described.

In the packing member 201 according to this embodiment, the projected portions 203 are formed at the side surfaces 202b to 202e of the recessed portion 202. This makes small the contact area between the side surfaces of the recessed portion 202 and the side surfaces of the LED package 1 when the LED package 1 is located. For this reason, the side surfaces of the LED package 1 are less likely to adhere to the side surfaces of the recessed portion 202, and the LED package 1 is easily handled. Thereby, for example, at the delivery destination, the operatability of unpacking the LED package 1 from the inside of the recessed portion 202 of the packing member 201 becomes favorable. Incidentally, since metallic lead frames are exposed from the lower surface of the LED package 1, the lower surface of the LED package 1 is originally less likely to adhere to the packing member.

Next, the eighth embodiment will be described.

Figure 24:
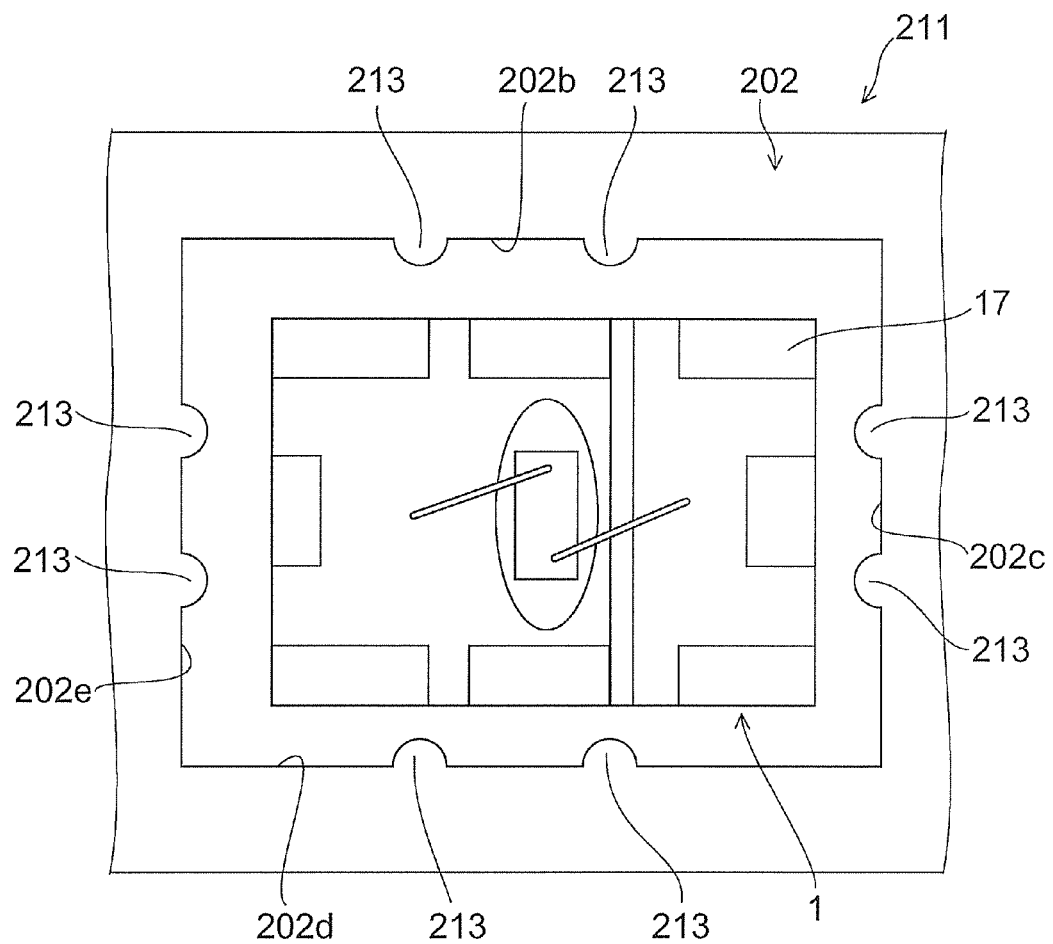
FIG. 24 is a plan view illustrating a packing member for an LED package according to an eighth embodiment.

FIG. 24 is a plan view illustrating a packing member for the LED package according to this embodiment.

As shown in FIG. 24, in a packing member 211 according to this embodiment, projected portions 213 formed at side surfaces of the recessed portion 202 have rounded tips. The projected portions 213 are semi-circular. This further reduces the contact area between the side surfaces of the recessed portion 202 and side surfaces of the LED package 1. The packing member 211 and the LED package are surely prevented from adhering to each other. Configuration, use method, effects and advantages, other than the above, of this embodiment are the same as those of the above-described seventh embodiment.

Next, the ninth embodiment will be described.

Figure 25:
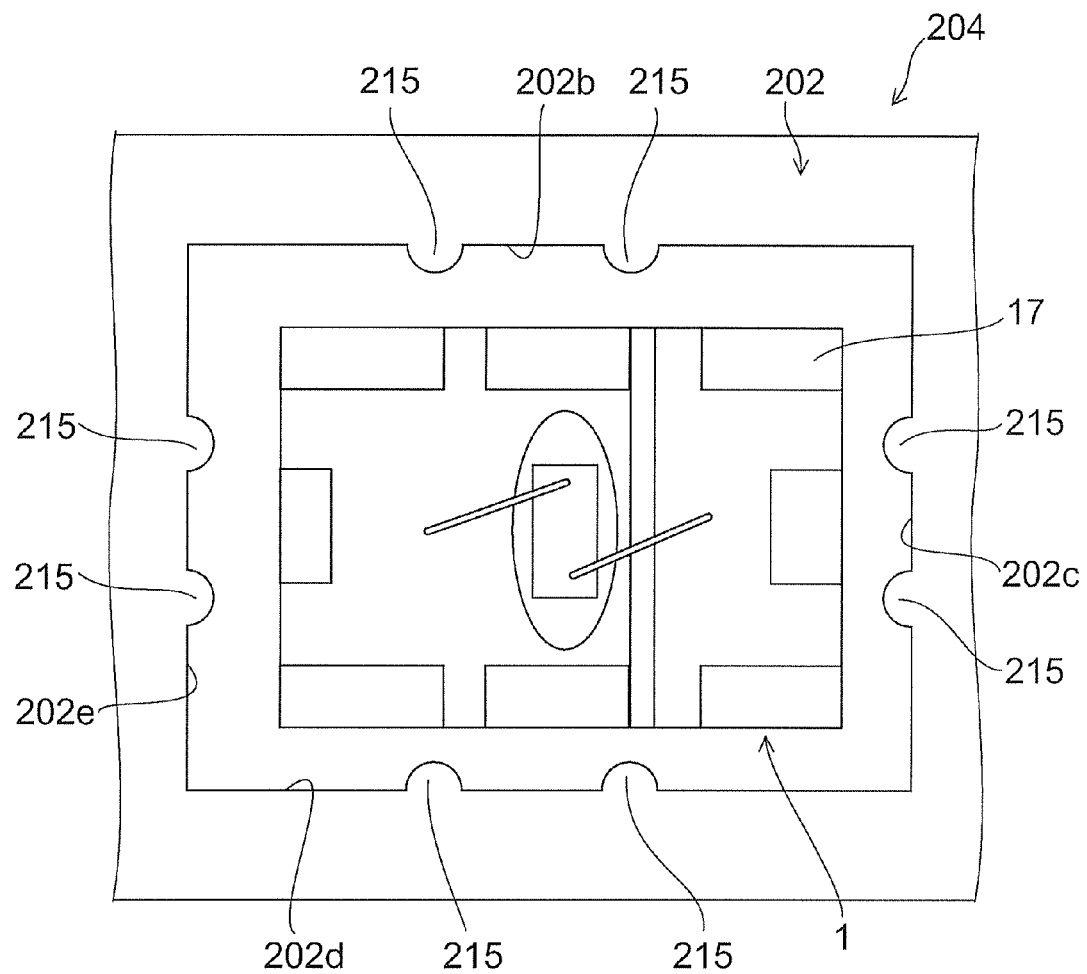
FIG. 25 is a plan view illustrating a packing member for an LED package according to a ninth embodiment.

FIG. 25 is a plan view illustrating a packing member for the LED package according to this embodiment.

Figure 26:
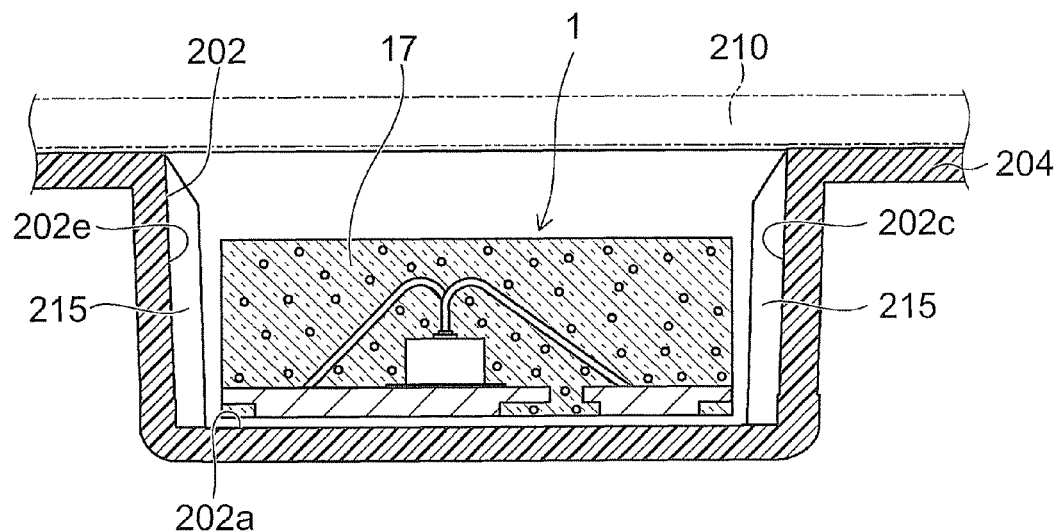
FIG. 26 is a cross-sectional view illustrating the packing member for the LED package according to the ninth embodiment.

FIG. 26 is a cross-sectional view illustrating the packing member for the LED package according to this embodiment.

As shown in FIGS. 25 and 26, in a packing member 204 according to this embodiment, projected portions 215 are formed at side surfaces of the recessed portion 202. Each of the projected portions 215 has a semi-circular shape extending in a depth direction of the recessed portion 202. Such packing members 204 can be manufactured by a pressing method, and accordingly are manufactured easily. Configuration, use method, effects and advantages, other than the above, of this embodiment are the same as those of the above-described eighth embodiment.

Next, the tenth embodiment will be described.

Figure 27:
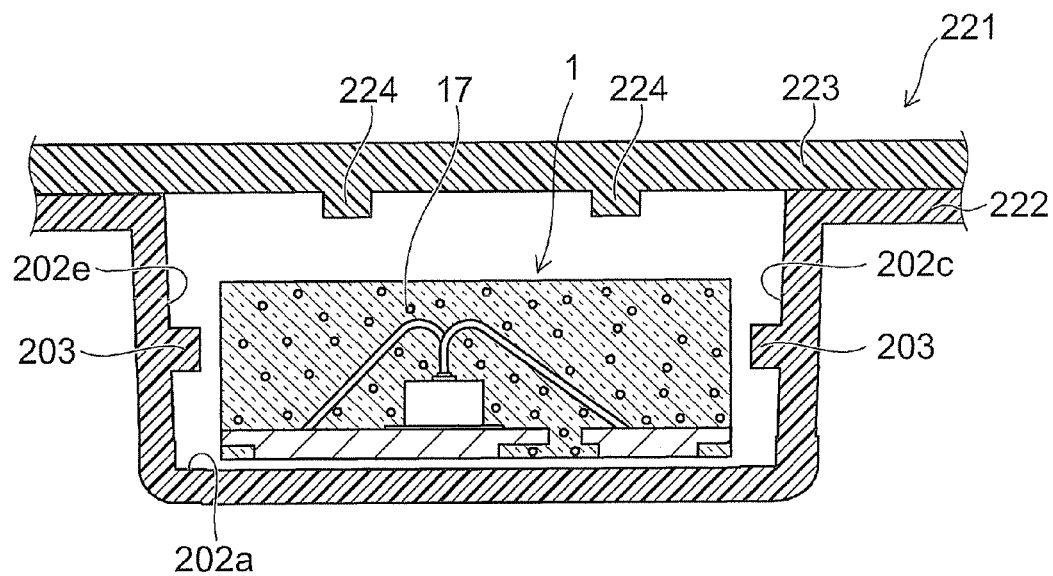
FIG. 27 is a cross-sectional view for illustrating a packing member for an LED package according to a tenth embodiment.

FIG. 27 is a cross-sectional view illustrating a packing member for the LED package according to this embodiment.

As shown in FIG. 27, a packing member 221 according to this embodiment includes a carrier tape 222 and a cover tape 223. The configuration of the carrier tape 222 is the same as the configuration of the above-described packing member 201 according to the seventh embodiment. The cover tape 223 is formed of, for example, a resin material or paper, and is formed of the same material as the material of, for example, the carrier tape 222. The cover tape 223 has such a belt-like shape as to cover the carrier tape 222. Moreover, projected portions 224 are formed at a lower surface, i.e., a surface facing the carrier tape 222, of the cover tape 223. The projected portions 224 are formed in regions of the carrier tape 222 facing the recessed portion 202 when the cover tape 223 is adhered to the carrier tape 222. Thus, unevenness is formed on the lower surface of the cover tape 223. The unevenness of the cover tape 223 is greater than unevenness formed on an upper surface of the LED package, i.e., an upper surface of a transparent resin body.

According to this embodiment, the unevenness is formed not only on the side surfaces of the recessed portion 202 of the carrier tape 222 but also on the lower surface of the cover tape 223. Thus, the upper surface of the LED package is prevented from adhering to the lower surface of the cover tape 223. Configuration, use method, effects and advantages, other than the above, of this embodiment are the same as those of the above-described seventh embodiment.

Note that, in the above-described seventh to tenth embodiments, examples have been shown that two projected portions are formed at each side surface of the recessed portion 202. However, the invention is not limited thereto. The number of projected portions at each side surface may be 1, 3, or larger. Moreover, the projected portions do not always have to be arranged in the direction parallel to the surface of the packing member. The arrangement of the projected portions may be shifted in a depth direction of the recessed portion 202. Furthermore, in the above-described seventh to tenth embodiments, examples have been shown that unevenness is formed by forming the projected portions at the side surfaces of the recessed portion. However, the invention is not limited thereto. For example, the unevenness may be formed by forming dents in the side surfaces, or such unevenness may be formed by curving the side surfaces. In this manner also, the contact area between the side surfaces of the recessed portion and the side surfaces of the LED package is reduced, and the adhesion is prevented. Still furthermore, in the above-described seventh to tenth embodiments, examples have been shown that the unevenness is formed on all the side surfaces of the recessed portion 202. However, the invention is not limited thereto. A certain level of the effect is obtained by forming the unevenness at least on one side surface. Still furthermore, the shape of the packing member for an LED package according to the invention is not limited to a belt-like shape, and may be, for example, a sheet-like shape in which recessed portions are arranged in a matrix pattern.

According to the above-described seventh to tenth embodiments, a packing member for the LED package easy to handle is provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A packing member housing an LED package, comprising:
   a carrier member, a recessed portion to locate the LED package being formed in the carrier member, first unevenness being formed on at least a portion of a side surface of the recessed portion; and
   a cover member for covering the recessed portion, second unevenness being formed on a lower surface of the cover member,
   the LED package having: first and second lead frames apart from each other; an LED chip provided above the first and second lead frames, the LED chip having one terminal connected to the first lead frame and another terminal connected to the second lead frame; and a resin body covering the first and second lead frames and the LED chip, and having an upper surface with a surface roughness of 0.15 µm or higher,
   the second unevenness of the cover member being greater than the surface roughness of the upper surface of the resin body.

2. The member according to claim 1, wherein
a projected portion is formed at the side surface of the recessed portion.

3. The member according to claim 2, wherein
the projected portion has a rounded tip.

4. The member according to claim 1, wherein
the carrier member has a belt-like shape, and
a plurality of the recessed portions are arranged in one row.

5. The member according to claim 1, wherein
the recessed portion is formed of one substantially rectangular bottom surface when seen from above and four side surfaces, and
two projected portions are formed at each side surface of the recessed portion.

6. The member according to claim 1, wherein
a first projected portion and a second projected portion are respectively formed at a lower surface of the first lead frame and a lower surface of the second lead frame of the LED package,
a lower surface of the first projected portion and a lower surface of the second projected portion are exposed from a lower surface of the resin body,
side surfaces of the first projected portion and side surfaces of the second projected portion are covered with the resin body,
the first lead frame and the second lead frame have a first edge and a second edge respectively, the first edge and the second edge face each other, the first projected portion is formed in a region being apart from the first edge, the second projected portion is formed in a region being apart from the second edge, and a portion having the first edge and a portion having the second edge are thin plate portions thinner than the regions having the first projected portion and the second projected portion,
each of the first lead frame and the second lead frame includes:
   a base portion; and
   a plural of extending portions extending from the base portion in different directions from one another, and having lower surfaces covered with the resin body and tip edge surfaces exposed as side surfaces of the resin body, and
edge surfaces of the base portion are covered with the resin body.

7. The member according to claim 6, wherein
the resin body has a rectangular shape when seen from above, and
tip edge surfaces of the extending portions each exposed as a corresponding one of three different side surfaces of the resin body.

8. The member according to claim 6, wherein
the LED package further has: a first wire connecting the one terminal to the first lead frame; a second wire connecting the another terminal to the second lead frame; and a third lead frame disposed between the first lead frame and the second lead frame,
the one terminal and the another terminal are provided on an upper surface of the LED chip, a portion of a lower surface and a portion of an edge surface of the third lead frame both are exposed from the resin body, and the LED chip is mounted on the third lead frame.

* * * * *